(12) United States Patent
Kawakami et al.

(10) Patent No.: US 6,498,515 B2
(45) Date of Patent: Dec. 24, 2002

(54) SEMICONDUCTOR INTEGRATED CIRCUIT AND METHOD FOR DESIGNING THE SAME

(75) Inventors: Yoshiyuki Kawakami, Osaka (JP); Nobufusa Iwanishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/142,969

(22) Filed: May 13, 2002

(65) Prior Publication Data

US 2002/0140460 A1 Oct. 3, 2002

Related U.S. Application Data

(62) Division of application No. 09/573,568, filed on May 19, 2000, now Pat. No. 6,396,307.

(30) Foreign Application Priority Data

May 19, 1999 (JP) ............................................. 11-139098

(51) Int. Cl.[7] .............................................. H03K 19/20
(52) U.S. Cl. ............................ 326/121; 326/93; 716/10
(58) Field of Search ............................ 326/26, 27, 93, 326/95, 96, 98, 112, 119, 121, 104; 716/8, 10

(56) References Cited

U.S. PATENT DOCUMENTS

| | | |
|---|---|---|
| 4,507,574 A | 3/1985 | Seki et al. |
| 5,889,416 A | 3/1999 | Lovett |
| 5,986,478 A | 11/1999 | Ohashi |
| 6,016,064 A | 1/2000 | Saeki |

FOREIGN PATENT DOCUMENTS

| | | |
|---|---|---|
| JP | 01094484 | 4/1989 |
| JP | 07099302 | 4/1995 |
| JP | 8-31893 | 2/1996 |
| JP | 9-292436 | 11/1997 |
| JP | 11-119853 | 4/1999 |

OTHER PUBLICATIONS

H.B. Bakoglu, "Circuits, Interconnections and Packaging for VLSI", pp. 40–43, published by Addison–Wesley Publishing Company, Inc., 1990.

Rhyne, "Fundamental of Digital Design", 1973, pp. 70–71.

*Primary Examiner*—Son Phu Le
(74) *Attorney, Agent, or Firm*—McDermott, Will & Emery

(57) ABSTRACT

A logical design method for a semiconductor integrated circuit includes the steps of: a) generating a circuit at a logical level so as to meet given functions and specifications; b) extracting a critical path, which will cause the longest delay, from the circuit generated in the step a); c) counting how many times a path leading from each input terminal to an output terminal in every logic cell of the circuit has operated; d) calculating a degradation rate associated with the path leading from each said input terminal to the output terminal in each said logic cell on the critical path by reference to the number of times of operation obtained in the step c); and e) exchanging a connection to one of the input terminals of each said logic cell, which terminal is associated with the critical path, with a connection to another one of the input terminals of the logic cell, which terminal is associated with another path corresponding to a lower degradation rate than that of the critical path, by reference to the degradation rates obtained in the step d).

14 Claims, 16 Drawing Sheets

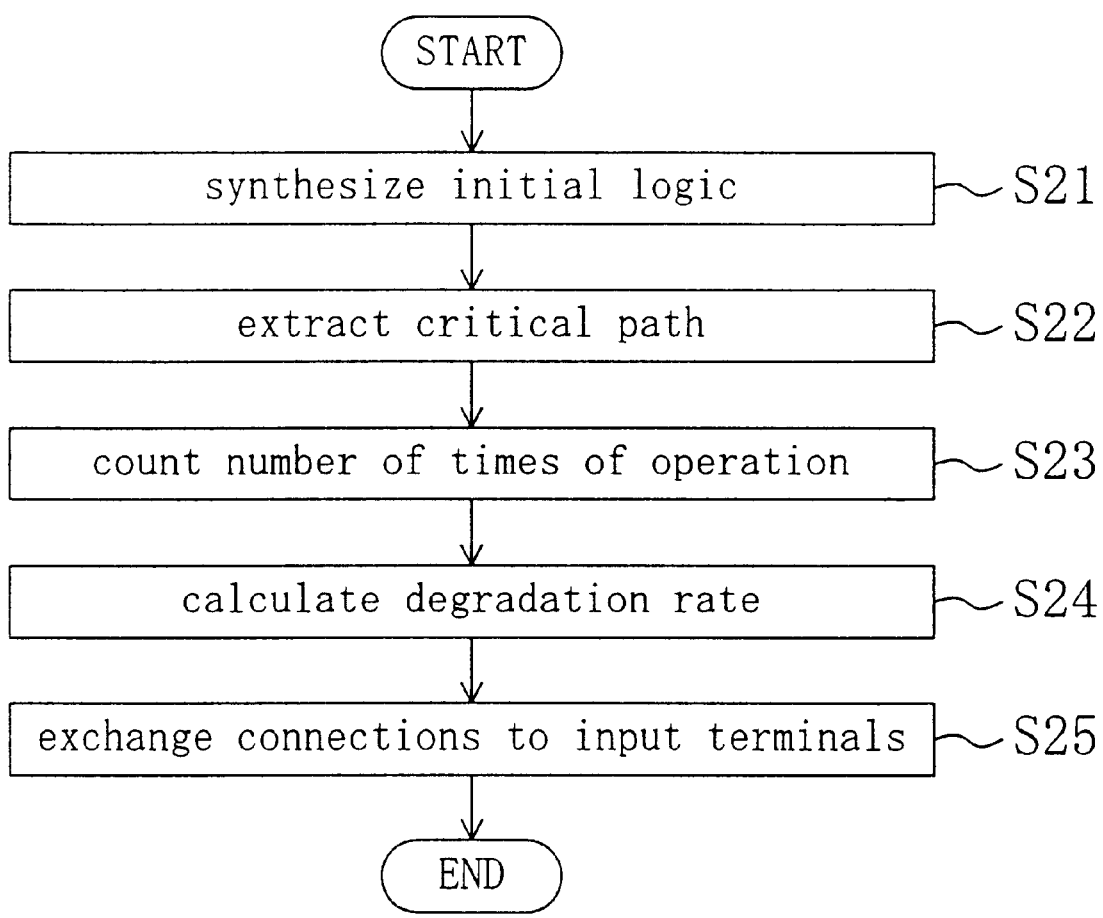

Fig. 4(b)

```
//
// BUFFER DEFINITION
//
//--------------------
// TEMPLATE
//--------------------
template std_degradation_3d{
            header{
                       from{pin=<in>}
                       to{pin=<out>}
                       slew_rate{
                               pin=<in>
                               table{① 2 3}
                       }
                       capacitance{
                               pin=<out>
                               table{1 ② 3 4}
                       }
                       age{
                               pin=<in>
                               pin=<out>
                               table{1 2 ③}
                       }
            }
}

//--------------------
// DELAY DEFINITION
//--------------------
vector(01 H01->10 N01){                  402
       degradation_rate{
                  table{
                       1.01  1.02  1.03  1.04
                       1.02  1.03  1.04  1.05   } age table=index#1
                       1.02  1.04  1.05  1.06
                       1.01  1.02  1.03  1.04
                       1.03  1.04  1.05  1.05   } age table=index#2
                       1.03  1.03  1.06  1.07
                       1.01  1.02  1.03  1.04
                       1.03  1.03  1.06  1.07   } age table=index#3
                       1.04  1.05  1.07  1.08
                  }
       }
}
```

```
//
// 2-NAND DEFINITION
//
//--------------------
// TEMPLATE
//--------------------
template std_degradation_1d{
            header{
                        degradation_order{
                                    pin=<in1, in2>
                        }
            }
}
```

SEMICONDUCTOR INTEGRATED CIRCUIT AND METHOD FOR DESIGNING THE SAME

This application is a divisional of application Ser. No. 09/573,568 filed May 19, 2000 now U.S. Pat. No. 6,396,307.

BACKGROUND OF THE INVENTION

The present invention relates to a semiconductor integrated circuit that is less affected by performance degradation of transistors with time, and also relates to a method for designing such a circuit.

Recent dramatic downsizing of semiconductor integrated circuits have caused various problems. As for transistors, a latch-up phenomenon and hot carrier effects are typical examples of those problems encountered often.

The hot carrier effects refer to a phenomenon in which greatly energetic electrons (which are also called "hot electrons") cross the junction of a semiconductor to enter the gate oxide of a transistor. After having entered the gate oxide, those hot electrons are trapped and accumulated in the oxide, thus increasing the threshold voltage of the transistor. As a result, the drivability of the current decreases. The longer the cumulative operation time of a transistor, the more degraded the transistor and the lower its operating speed become due to the hot carrier effects.

This degradation phenomenon is possibly retarded either by weakening the electric field within the channel or by reducing the current flowing through the transistor. In general, as a transistor is downsized, the supply voltage tends to decrease. However, since the effective channel length Leff also becomes shorter correspondingly, the electric field within the channel does not always weaken. Also, it would not be advantageous either to reduce the current flowing through the transistor. This is because the drivability of the transistor and the performance of an LSI, including that transistor, would both decline.

For further details of physical phenomena like these, see "Circuits, Interconnections and Packaging for VLSI", Addison-Wesley Publishing Company, Inc.

In the prior art, the performance degradation of a transistor due to hot carrier effects has been estimated on a transistor-by-transistor basis. For example, transistors with degraded performance are spotted by incorporating a hot carrier effect degradation model into a circuit simulator (see, e.g., Japanese Laid-Open Publication No. 1-94484). According to another technique, the stress dependence of indices in a degradation rate equation is obtained, thereby simulating degradation due to the hot carrier effects under an AC stress (see, e.g., Japanese Laid-Open Publication No. 7-99302).

In the currently available timing simulation technique for logic circuits, the logic circuits are tested on the assumption that the performance of the logic circuits would not degrade with time. Actually, though, the transistors do degrade due to the hot carrier effects, and therefore, degradation of the logic circuits is also unavoidable. For example, delays of the logic circuits increase with time.

Particularly when a logic circuit on a critical path degrades after a long-time use, the performance of the entire circuit cannot be ensured even if proper operation thereof is ensured in its initial state. Thus, logic circuits should also be designed while taking future degradation thereof into account.

In addition, a degraded logic circuit also causes a problem in delivering a clock signal. In recent years, a gated clocking technique is often adopted for an LSI to reduce the power dissipation thereof. That is to say, where just a part of an LSI has to be operated, if a clock signal is delivered to the other unneeded part of the LSI, power is wasted by the clock delivery circuit in vain. Thus, according to the gated clocking technique, the clock delivery circuit is provided with a circuit for selectively delivering the clock signal to only the necessary part of an LSI.

FIG. 16(a) illustrates a conventional technique of delivering a clock signal. As shown in FIG. 16(a), a clock signal is always delivered from a clock signal source to both circuits A and B. In this case, the signal delivered to the circuits A and B changes its level the same number of times and therefore both of these circuits A and B degrade to the same degree. Thus, even after these circuits A and B have degraded with time, the clock skew between internal clock signals for the circuits A and B does not increase.

FIG. 16(b) illustrates a gated clocking technique. An AND circuit 73 is inserted as a clock controller between a circuit for delivering a clock signal to the circuit A and the circuit A. In response to a control signal input, the AND circuit 73 may stop delivering the clock signal to the circuit A. At a point in time, the total numbers of times the clock signal delivered to the circuits A and B has changed its level may be $10^{14}$ and $10^{16}$, respectively. In such a situation, the circuit B degrades at a higher rate and causes a longer delay than the circuit A. As a result, the clock skew between the internal clock signals for the circuits A and B increases after these circuits have degraded with time.

Furthermore, a clock net is generally implemented as a clock tree, in which degradation rates are also variable among the clock controllers for respective branches. Accordingly, after a long time has passed, the clock skew may also increase for that reason.

SUMMARY OF THE INVENTION

It is therefore an object of the present invention to provide (1) a semiconductor integrated circuit that is less affected by performance degradation with time by implementing transistors in such a configuration as suppressing the degradation due to hot carrier effects, and (2) a method for designing such a circuit.

Specifically, an inventive semiconductor integrated circuit includes a complementary metal oxide semiconductor (CMOS) logic circuit with multiple input terminals. The CMOS logic circuit includes a plurality of serial connections of n-channel transistors. The serial connections are connected in parallel to each other between an output terminal and a ground line. In every one of the serial connections, each said input terminal is connected to the gate of at least one of the n-channel transistors. And in at least one of the serial connections, the input terminal is connected to the gate of one of the n-channel transistors that is more distant from the output terminal than another one of the n-channel transistors that is closest to the output terminal is.

According to the present invention, none of the input terminals of the CMOS logic circuit is connected to ONLY the n-channel transistors that are closest to the output terminal and most likely to degrade. Thus, there is no path in which a delay from the input terminal to the output terminal changes significantly due to degradation of the transistors.

In one embodiment of the present invention, each said input terminal is connected to the gate of one of the n-channel transistors in every one of the serial connections so as to minimize a maximum sum of degradation rates of the n-channel transistors that are connected to the same input terminal.

In such an embodiment, it is possible to average the rates of increase in delay time caused by the paths from respective input terminals to the output terminal due to degradation with time. Thus, none of the paths increases the delay time outstandingly.

An inventive logical design method for a semiconductor integrated circuit includes the steps of: a) generating a circuit at a logical level so as to meet given functions and specifications; b) extracting a critical path, which will cause the longest delay, from the circuit generated in the step a); c) counting how many times a path leading from each input terminal to an output terminal in every logic cell of the circuit has operated; d) calculating a degradation rate associated with the path leading from each said input terminal to the output terminal in each said logic cell on the critical path by reference to the number of times of operation obtained in the step c); and e) exchanging a connection to one of the input terminals of each said logic cell, which terminal is associated with the critical path, with a connection to another one of the input terminals of the logic cell, which terminal is associated with another path corresponding to a lower degradation rate than that of the critical path, by reference to the degradation rates obtained in the step d).

According to the inventive design method, it is possible to reduce the increase in delay due to degradation on the critical path, thus suppressing degradation of the overall circuit with time.

In one embodiment of the present invention, the degradation rates are obtained in the step d) using a delay library in which data about the degradation rates associated with multiple paths leading from the respective input terminals to the output terminal of each said logic cell is stored.

In such an embodiment, the degradation rate data stored in the delay library can be referred to in the design process. Thus, a circuit can be designed in view of the degradation of the circuit with time without performing simulations on the degradation.

Another inventive logical design method for a semiconductor integrated circuit uses a delay library in which data about a multi-input logic cell, including a plurality of input terminals, is stored. The data is so described as to obtain representative ranking of degradation rates associated with multiple paths between respective input terminals and an output terminal of the multi-input logic cell without specifying operating conditions for the paths.

According to the inventive method, a circuit can be designed easily in view of its degradation with time and without taking the difference in operating conditions (e.g., number of times of operation) among the respective path into account.

In one embodiment of the present invention, the data represents ranking of the degradation rates associated with the respective paths in the same logic cell.

In such an embodiment, the ranking of degradation rates associated with respective path in each logic cell can be known immediately.

In another embodiment of the present invention, the logical design method includes the steps of: a) generating a circuit at a logical level so as to meet given functions and specifications; b) extracting a critical path, which will cause the longest delay, from the circuit generated in the step a); c) selecting the multi-input logic cell from logic cells on the critical path; and d) exchanging a connection to one of the input terminals of the multi-input logic cell selected in the step c), which terminal is associated with the critical path, with a connection to another one of the input terminals of the logic cell, which terminal is associated with another path corresponding to a lower degradation rate than that of the critical path, by reference to the data stored in the delay library.

In such an embodiment, increase in delay on the critical path due to degradation with time can be suppressed without taking the difference in operating conditions (e.g., number of times of operation) into account.

In still another embodiment, an output of a logic cell implemented as a single-stage transistor is provided to one of the input terminals of the multi-input logic cell by reference to the data stored in the delay library. The terminal provided with the output is associated with one of the paths of the logic cell other than another one of its paths that corresponds to the highest degradation rate.

In such an embodiment, degradation with time can be suppressed in a logic cell next to a logic cell with a single-stage transistor structure.

In still another embodiment, the logical design method includes the steps of: a) generating a circuit at a logical level so as to meet given functions and specifications; b) obtaining switching probabilities of signals provided to the respective input terminals of the multi-input logic cell in the circuit; and c) modifying connections such that one of the signals with the highest switching probability is provided to one of the input terminals of the multi-input logic cell by reference to the data stored in the delay library. The input terminal provided with the signal is associated with one of the paths of the logic cell other than another one of its paths that corresponds to the highest degradation rate.

In such an embodiment, the number of times a path, which is most likely to degrade with time, has to operate can be reduced in the logic cell. Thus, increase in delay on that path can be suppressed.

In still another embodiment, an output of a sequential logic circuit operating synchronously with a clock signal is provided to one of the input terminals of the multi-input logic cell by reference to the data stored in the delay library. The terminal provided with the output is associated with one of the paths of the logic cell other than another one of its paths that corresponds to the highest degradation rate.

In such an embodiment, the number of times a path, which is most likely to degrade with time, has to operate can be reduced in the logic cell, to which the output of the sequential logic circuit is provided. Thus, increase in delay on that path can be suppressed.

In still another embodiment, if an output of a sequential logic circuit operating synchronously with a clock signal is provided to a single-input logic cell, the single-input logic cell is replaced with the multi-input logic cell. The output is provided to one of the input terminals of the multi-input logic cell by reference to the data stored in the delay library. The terminal provided with the output is associated with one of the paths of the logic cell other than another one of its paths that corresponds to the highest degradation rate.

In such an embodiment, a path of the multi-input logic cell that is least likely to degrade with time is operated instead of the single-input logic cell. Thus, increase in delay is avoidable with more certainty compared to the single-input logic cell.

Another inventive semiconductor integrated circuit includes an AND logic circuit with three or more input terminals and a serial connection of n-channel transistors. A clock signal is provided to a first one of the input terminals of the logic circuit. A signal controlling clock delivery is provided to a second one of the input terminals of the logic circuit. And a potential in logically high state is applied to the other input terminals of the logic circuit. The first input terminal is connected to the gate of one of the n-channel transistors in the serial connection. The n-channel transistor is more distant from the output terminal than another one of the n-channel transistors that is closest to the output terminal is.

In the inventive semiconductor integrated circuit, a clock signal, which changes its level frequently, is input to the gate of the transistor that is less likely to degrade. Thus, a circuit, which is less likely to degrade or increase its clock skew, is realized.

Still another inventive semiconductor integrated circuit also includes an AND logic circuit with three or more input terminals and a serial connection of n-channel transistors. A clock signal is provided to a first one of the input terminals of the logic circuit. A signal controlling clock delivery is provided to a second one of the input terminals of the logic circuit. And a potential in logically high state is applied to the other input terminals of the logic circuit. The first input terminal is connected to the gate of one of the n-channel transistors in the serial connection. The n-channel transistor is other than another one of the n-channel transistors that has the highest degradation rate.

In the inventive semiconductor integrated circuit, a clock signal is input to the gate of the transistor that is least likely to degrade. Thus, a circuit, which is less likely to degrade or increase its clock skew, is realized.

In an inventive method for designing a semiconductor integrated circuit, increase in signal propagation delay due to degradation of the circuit is suppressed by replacing an inverter with a NAND cell including two or more input terminals and a serial connection of n-channel transistors. An input terminal of the inverter is replaced with one of the input terminals of the NAND cell that is connected to the gate of one of the n-channel transistors in the serial connection. The n-channel transistor is more distant from an output terminal than another one of the n-channel transistors that is closest to the output terminal is. An output terminal of the inverter is replaced with an output terminal of the NAND cell. And a potential in logically high state is applied to the other input terminals of the NAND cell.

According to the inventive method, when a NAND cell is operated as an inverter, an input signal is provided to the gate of one of its transistors with the lowest degradation rate. Thus, the resulting circuit will degrade to a much lesser degree.

BRIEF DESCRIPTION OF THE DRAWINGS

FIG. 2 is a flowchart illustrating a logical design method for a semiconductor integrated circuit according to a second embodiment of the present invention.

FIGS. 4(a) and 4(b) illustrate an exemplary delay library applicable to the second embodiment.

DESCRIPTION OF THE PREFERRED EMBODIMENTS

Hereinafter, preferred embodiments of the present invention will be described with reference to the accompanying drawings.

EMBODIMENT 1

First, it will be described how a logic circuit will be affected by degradation caused in a transistor due to hot carrier effects.

Figure 1A:
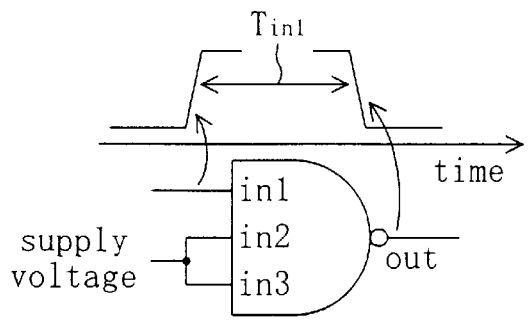
FIGS. 1(a) through 1(d) are circuit diagrams illustrating NAND circuits according to a first embodiment of the present invention.
Figure 1B:
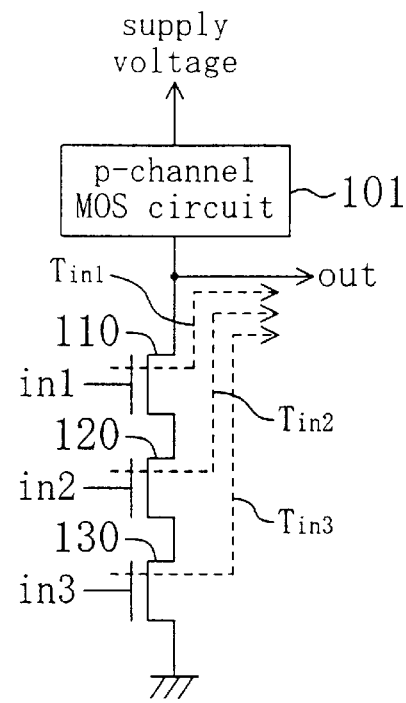

FIG. 1(a) illustrates a three-input NAND circuit, while FIG. 1(b) illustrates a CMOS logic circuit including the NAND circuit shown in FIG. 1(a). In the illustrated embodiment, a delay time $T_{in1}$ for a path leading from an input terminal in1 to an output terminal out is defined as a time interval between the application of a signal at the input terminal in1 and the appearance of the signal at the output terminal out in the initial state where an n-channel transistor 110 is not degraded at all. That is to say, the delay time refers to an interval between a point in time a signal with a rising or falling edge is applied to the input terminal in1 and a supply voltage is applied to the other input terminals in2 and in3 and a point in time a signal level changes at the output terminal out in response to the input signal. The same definition is applied to delay times $T_{in2}$ and $T_{in3}$ for the other two paths.

The delay of an n-channel transistor is affected by hot carrier effects much more greatly than the delay of a p-channel transistor. Thus, only a circuit section composed of n-channel transistors will be described in detail. In FIG. 1(b), a circuit section composed of p-channel transistors is illustrated as a p-channel MOS circuit 101. And the p-channel MOS circuit 101 is connected in series to a circuit in which the three n-channel transistors 110, 120 and 130 are connected in series together. In the following description, a "transistor" will refer to an n-channel transistor unless stated otherwise.

The drain of the transistor 110 is connected to the output terminal out of the NAND circuit. The source of the transistor 110 is connected to the drain of the transistor 120. The source of the transistor 120 is connected to the drain of the transistor 130. And the source of the transistor 130 is connected to a ground line. The input terminals in1, in2 and in3 of the NAND circuit are connected to the gates of the transistors 110, 120 and 130, respectively.

In this case, all of these transistors 110, 120 and 130 are in their initial state, where no hot carrier effects are observable yet. Suppose a supply voltage is applied to the input terminals in2 and in3 and a signal with a rising edge is applied to the input terminal in1. Then, the transistor 110 will degrade with time due to hot carrier effects. As a result, the threshold voltage of the transistor 110 will rise and the operating speed thereof will decrease, thus increasing the signal propagation delay in the NAND circuit. In other words, the degradation of the transistors 110, 120 and 130 will result in increased signal propagation delay in the NAND circuit.

The delay time $T_{in1}$ of the path leading from the input terminal in1 to the output terminal out after the transistor 110 has degraded is generally greater than the initial delay time $T_{in1}$:

$$T_{in1} < T'_{in1}$$

The same relationship is applied to delay times $T'_{in2}$ and $T'_{in3}$ of respective paths leading from the input terminals in2 and in3 to the output terminal out after the transistors 120 and 130 have degraded.

In this specification, the ratio of the delay time $T'_{in1}$ of the path leading from the input terminal in1 to the output terminal out of the NAND circuit after the transistor 110 has degraded to the delay time $T_{in1}$ of the same path when the transistor 110 is in its initial state is defined as a degradation rate $DR_{in1}$ of the path. That is to say, $$DR_{in1} = T'_{in1}/T_{in1}$$

The degradation rates $DR_{in2}$ and $DR_{in3}$ of respective paths leading from the input terminals in2 and in3 to the output terminal out are obtainable in the same way for the degradation of the transistors 120 and 130. We found based on the results of simulation and actual measurement that the following relationship $$DR_1 >> DR_{in2}, DR_{in3}$$

is met among these degradation rates.

This is because the degradation resulting from hot carrier effects is most serious in the transistor 110 that is closest to the output terminal, i.e., closest to the power supply.

It is probably because the transistors located between the transistors 120 and 130 and the output terminal out, i.e., the transistor 110 and so on, function as resistors that the transistors 120 and 130 do not degrade so seriously as the transistor 110. That is to say, the drain voltages of the transistors 120 and 130 would decrease and the field intensity of the channel would also decline in such a case.

In the same way, the degradation rate $Deg_{110}$ of the transistor 110 in the NAND circuit shown in FIG. 1(b) is also obtained as the ratio of the delay times:

$$Deg_{110} = T'_{in1}/Tin1$$

Thus, the degradation rates $Deg_{120}$ and $Deg_{130}$ of the transistors 120 and 130 are also represented as respective delay time ratios:

$$Deg_{120} = T'_{in2}/Tin2$$

$$Deg_{130} = T'_{in3}/T_{in3}$$

Accordingly, the following relationship $$Deg_{110} >> Deg_{120}, Deg_{130}$$

is also met among these degradation rates of the transistors 110, 120 and 130.

The above relationship is also true of a NAND circuit with two, four or more inputs. That is to say, a transistor closest to the output terminal has the highest degradation rate and a path associated with that transistor shows a highest degradation rate.

Thus, such imbalance in degradation rates among mutually different paths of a NAND circuit should be eliminated. In the illustrated embodiment, the sizes of the three transistors included in the NAND circuit shown in FIG. 1(b) are supposed to be equal to each other. Also, a circuit with the same function as the NAND circuit shown in FIG. 1(b) will be formed by equally dividing each of the transistors 110, 120 and 130 into two.

First, the transistor 110 is divided into two transistors 111 and 112 of a size. In the same way, each of the other transistors 120 and 130 is also divided into two same-sized transistors 121 and 122 and 131 and 132, respectively.

Figure 1C:
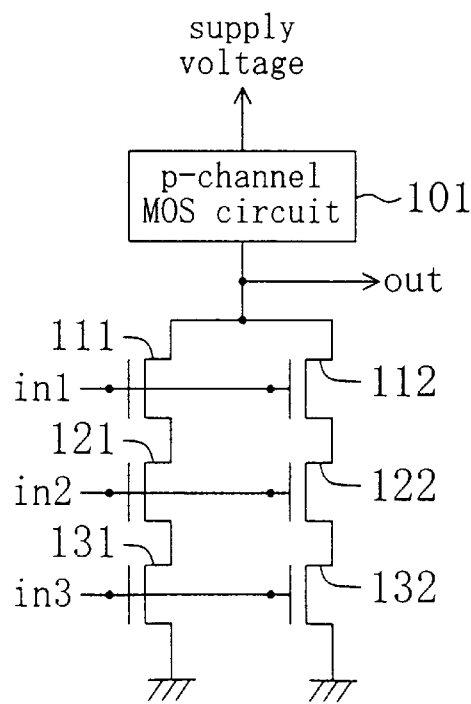

Next, the serial connection of the three transistors 110, 120 and 130 shown in FIG. 1(b) is replaced with two serial connections of three divided transistors 111, 121, 131 and 112, 122, 132. These serial connections are connected in parallel to each other as shown in FIG. 1(c). Specifically, the drain of the transistor 111 is connected to the output terminal out of the NAND circuit. The source of the transistor 111 is connected to the drain of the transistor 121. The source of the transistor 121 is connected to the drain of the transistor 131. And the source of the transistor 131 is connected to a ground line. The other set of three divided transistors 112, 122 and 132 are also connected in series together in the same manner.

Even in such a serial connection of divided transistors, the transistor closest to the output terminal also has the highest degradation rate. That is to say, the degradation rates of the transistors in the two sets 111, 121, 131 and 112, 122, 132 also meet the relationships $$Deg_{111} >> Deg_{121}, Deg_{131}$$

$$Deg_{112} >> Deg_{122}, Deg_{132}$$

just like the degradation rates of the transistors 110, 120 and 130.

Generally speaking, the larger the number of times a transistor has ever operated, the lower its operating speed and the more degraded the transistor become. Thus, the degradation rate of the path passing the transistor also increases correspondingly. For example, the gates of the transistors 111 and 112 may be connected to the input terminal in1 of the NAND circuit, the gates of the transistors 121 and 122 to the input terminal in2 and the gates of the transistors 131 and 132 to the input terminal in3 as shown in FIG. 1(c). In that case, the sum of degradation rates $Deg_{111}$ and $Deg_{112}$ of the transistors 111 and 112 connected to the input terminal in1 is the largest among the three transistor pairs connected to the respective input terminals in1, in2 and in3. Thus, the degradation rates associated with these three paths also meet the relationship $$DR_{in1} >> DR_{in2}, DR_{in3}$$

That is to say, the degradation rate $DR_{in1}$ is by far the highest, too.

Figure 1D:
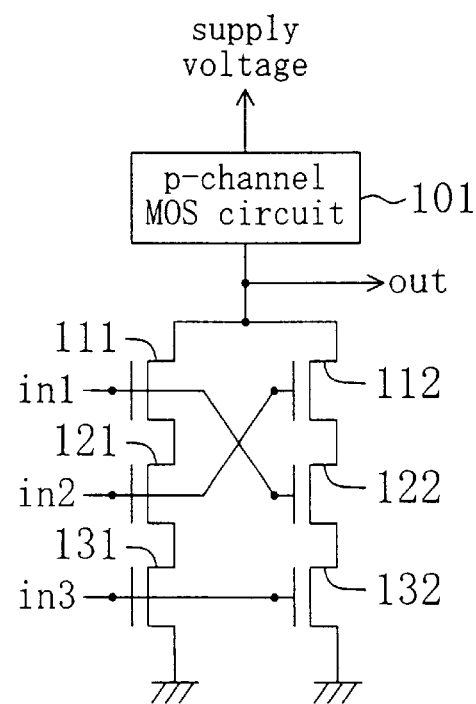

To eliminate such imbalance, these transistors should be connected differently such that the maximum sum of degradation rates among the three transistor pairs connected to the respective input terminals is minimized. Specifically, as shown in FIG. 1(d), the transistor 111 causing degradation at the highest rate is combined with the transistor 122 causing degradation at a lower rate, and the gates of these transistors 111 and 122 are connected to the input terminal in1 of the NAND circuit. In the same way, the transistor 112 causing degradation at the highest rate is combined with the transistor 121 causing degradation at a lower rate, and the gates of these transistors 112 and 121 are connected to the input terminal in2 of the NAND circuit.

Then, the sum of the degradation rates of the transistors 111 and 122 connected to the input terminal in1 is approximately equal to the sum of the degradation rates of the transistors 121 and 112 connected to the input terminal in2. Accordingly, in that case, the degradation rate $DR'_{in1}$ associated with the path between the input terminal in1 and the output terminal out, the degradation rate $DR'_{in2}$ associated with the path between the input terminal in2 and the output terminal out and the degradation rate $DR_{in1}$ associated with the path between the input terminal in1 and the output terminal out in the circuit shown in FIG. 1(c) meet the following relationship:

$$DR_{in1} > DR'_{in1} \approx DR'_{in2}$$

Since there is no path with an outstandingly high degradation rate, the performance of the circuit will not change so much even after the transistors have degraded with time.

According to the present invention, each input terminal should be connected to an n-channel transistor that is at most second closest to the output terminal in at least one of the serial connections. That is to say, the transistors 111 and 112 with the highest degradation rates should not be combined with each other in the illustrated embodiment. But the transistor 111 may be combined with the transistor 132 that is third closest to the output terminal, and the gates of these transistors 111 and 132 may be connected to the input terminal in1 of the NAND circuit.

As described above, a serial connection of n-channel transistors is divided into two serial connections to be connected in parallel between the output terminal of a NAND circuit and a ground line. And a transistor with a relatively high degradation rate in one of the two serial connections is combined with another transistor with a relatively low degradation rate in the other serial connection. In this manner, the imbalance in degradation rate among multiple paths can be reduced in the NAND circuit.

In the foregoing embodiment, a serial connection of n-channel transistors is divided into two serial connections to be connected in parallel together. Alternatively, the original serial connection of n-channel transistors may be divided into three or more serial connections.

Even in a NAND circuit with two, four or more inputs and in any other circuit in which multiple n-channel transistors are connected in series together between an output terminal and a ground line, the imbalance in degradation rate can be reduced in the same way among multiple paths.

EMBODIMENT 2

Next, a logical design method for a semiconductor integrated circuit, which is made up of functional blocks or logic blocks including logic cells, will be described as a second exemplary embodiment of the present invention.

FIG. 2 is a flowchart illustrating a logical design method for a semiconductor integrated circuit according to the second embodiment. FIGS. 3(a) through 3(d) are circuit diagrams illustrating the design method shown in FIG. 2 by way of example. As shown in FIG. 2, the design process includes the steps of: synthesizing initial logic S21; extracting a critical path S22; counting the number of times of operation S23; calculating the degradation rate S24; and exchanging connections for input terminals S25, respectively.

Figure 3A:
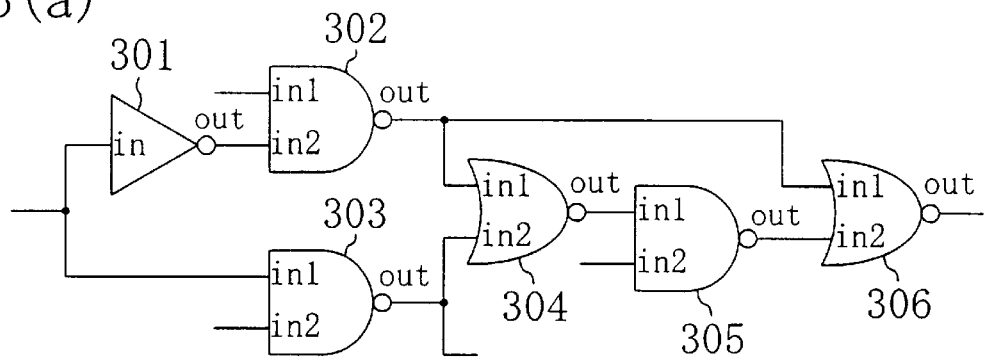
FIGS. 3(a) through 3(d) are circuit diagrams illustrating the design method shown in FIG. 2 by way of example.

First, in Step S21, a logical design process is carried out using a logic library, at which multiple standard logic circuits like NAND and NOR circuits are registered as logic cells, in accordance with a functional description obtained by the functional design of an LSI. In this logical design process, circuits at logical level are generated using an automated logic synthesis tool as is ordinarily done in the art. FIG. 3(a) illustrates a circuit generated as a result of this process step. As shown in FIG. 3(a), this circuit includes an inverter 301, three NAND cells 302, 303 and 305 and two NOR cells 304 and 306.

Next, in Step S22, a critical path, i.e., a path that will cause the longest delay, is extracted from this circuit. The critical path of the circuit shown in FIG. 3(a) is indicated by the bold line in FIG. 3(b). Specifically, the critical path passes in and out of the inverter 301, in2 and out of the NAND cell 302, in1 and out of the NOR cell 304, in1 and out of the NAND cell 305 and in2 and out of the NOR cell 306 in this order.

Figure 3B:
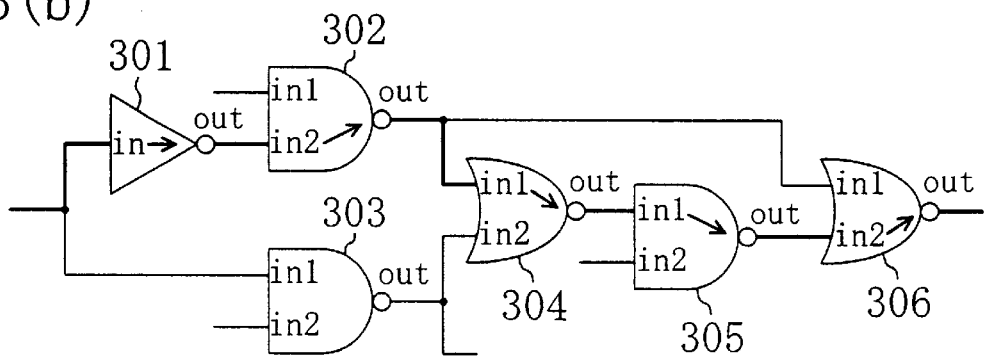
Figure 3C:
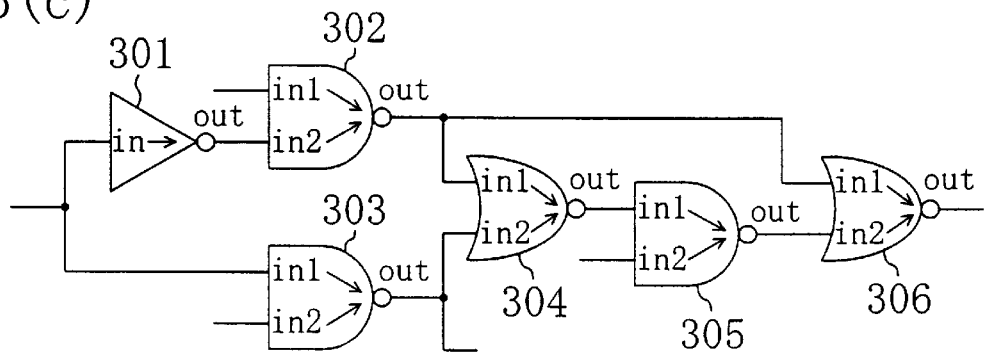

Then, in Step S23, logic simulations are carried out to obtain the cumulative number of times of operation for every path in each logic cell as indicated by the arrows in FIG. 3(c), e.g., a path from the input terminal in2 to the output terminal out of the NAND cell 302. In a path leading from an input terminal of a logic cell to its output terminal, the "number of times of operation" herein counts "1" when the output signal thereof changes its level responsive to a signal pulse with a rising or falling edge applied to the input terminal. In the illustrated embodiment, the number of times of operation is defined for a path in each logic cell as the number of times event changes in response to a test vector provided to primary inputs.

Subsequently, in Step S24, the degradation rate is calculated for every path connecting an input terminal to the output terminal of each logic cell on the critical path in accordance with the number of times of operation obtained. The degradation rate is obtained based on the result of simulated degradation of a path for each logic cell or using a delay library. The degradation rate associated with each path is defined as in the first embodiment.

The delay library storing data about the degradation rates for use in Step S24 will be described. This delay library is characterized by storing the data about the degradation rate associated with a path from an input terminal to the output terminal of each logic cell. And the data is defined using the "age", or number of years of operation, as a parameter.

Figure 4A:
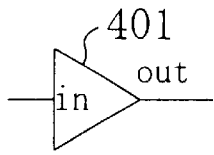

FIGS. 4(a) and 4(b) illustrate an exemplary delay library for use in the second embodiment. This delay library is a pseudo delay library described after an advanced library format (ALF), which is a library description language. FIG. 4(a) illustrates a buffer 401 with an input terminal in and an output terminal out. FIG. 4(b) illustrates a degradation rate calculating function used for obtaining a degradation rate associated with a path from the input terminal in to the output terminal out of the buffer 401.

As shown in FIG. 4(b), the degradation rate calculating function defines "slew_rate" (i.e., gradient of an input signal waveform), "capacitance" (i.e., output load capacitance) and "age" (i.e., number of years of operation) as parameters for deriving a degradation rate in the std_ degradation_3d section of TEMPLATE. On the other hand, the degradation rates themselves are defined in a degradation rate table 402 in the vector section shown in FIG. 4(b).

The age is represented as a value corresponding to the number of times of operation obtained in Step S23. Since the degradation rate of the buffer 401 is represented using the three parameters of the gradient of an input signal waveform, output load capacitance and number of years of operation. Thus, the degradation rate table 402 is represented as a three-dimensional table in the vector section. As for a cell with multiple input terminals, a table like this is defined for each signal path.

For example, if "1", "2" and "3" have been selected as "slew_rate", "capacitance" and "age", respectively, the degradation rate calculating function outputs 1.02, which is a data item on the first row, second column of the data referenced by index#3, as the degradation rate.

Finally, in Step S25, a connection route is modified to minimize the sum of the degradation rates. Specifically, in each logic cell on the critical path, the degradation rates obtained in Step S24 for respective paths in the logic cell are compared to each other and a path resulting in the lowest degradation rate is selected.

Figure 3D:
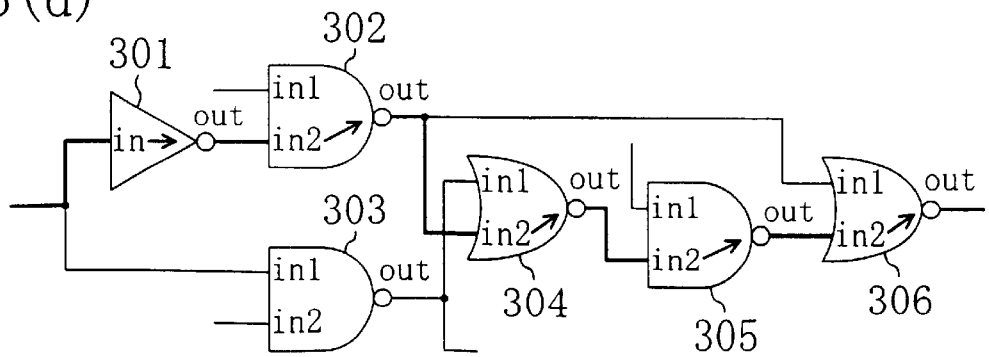

For example, in the NOR cell 304 shown in FIG. 3(c), the degradation rate $DR_{in1}$ of the path from the input terminal in1 to the output terminal out is compared to the degradation rate $DR_{in2}$ of the path from the input terminal in2 to the output terminal out. If $DR_{in1}$ is found larger than $DR_{in2}$ by reference to the data about the degradation rates obtained in Step S24, then the connection route is modified such that the input to the input terminal in1 on the critical path is provided to the input terminal in2 associated with the lower degradation rate. That is to say, the connections to the input terminals in1 and in2 of the NOR cell 304 shown in FIG. 3(b) are exchanged with each other as shown in FIG. 3(d).

Suppose the data about degradation rates obtained in Step S24 shows that the degradation rate associated with a path from the input terminal in1 to the output terminal out is greater than the degradation rate associated with a path from the input terminal in2 to the output terminal out in each of the NAND cells 302 and 305 and the NOR cell 306. In such a case, the connections to the input terminals in1 and in2 are also exchanged with each other in the NAND cell 305 as in the NOR cell 304. In the NAND and NOR cells 302 and 306 on the other hand, the critical path passes their input terminals in2 and therefore their connections need not be exchanged.

In this manner, according to this embodiment, a path that will cause the lower degradation due to hot carrier effects is selected within a logic cell on the critical path, thereby minimizing the increase in delay on the critical path because of the degradation with time. As a result, the degradation of the entire circuit can be suppressed.

Optionally, the delay library may store the degradation rate ranking of multiple paths in a single logic cell.

In the foregoing embodiment, the delay library storing data about the degradation rates is used for logical design. Alternatively, the delay library is also applicable to physical layout design.

EMBODIMENT 3

In the second embodiment, a logical design method for a semiconductor integrated circuit, made up of functional blocks or logical blocks including logic cells, has been described as using the degradation rate data defined in view of the operating conditions for respective paths as illustrated in FIG. 4(b). In accordance with the data adopted in the third embodiment, however, the degradation rates associated with multiple paths in the same logic cell can be ranked without taking difference in operating conditions among the paths into account.

Figure 5:
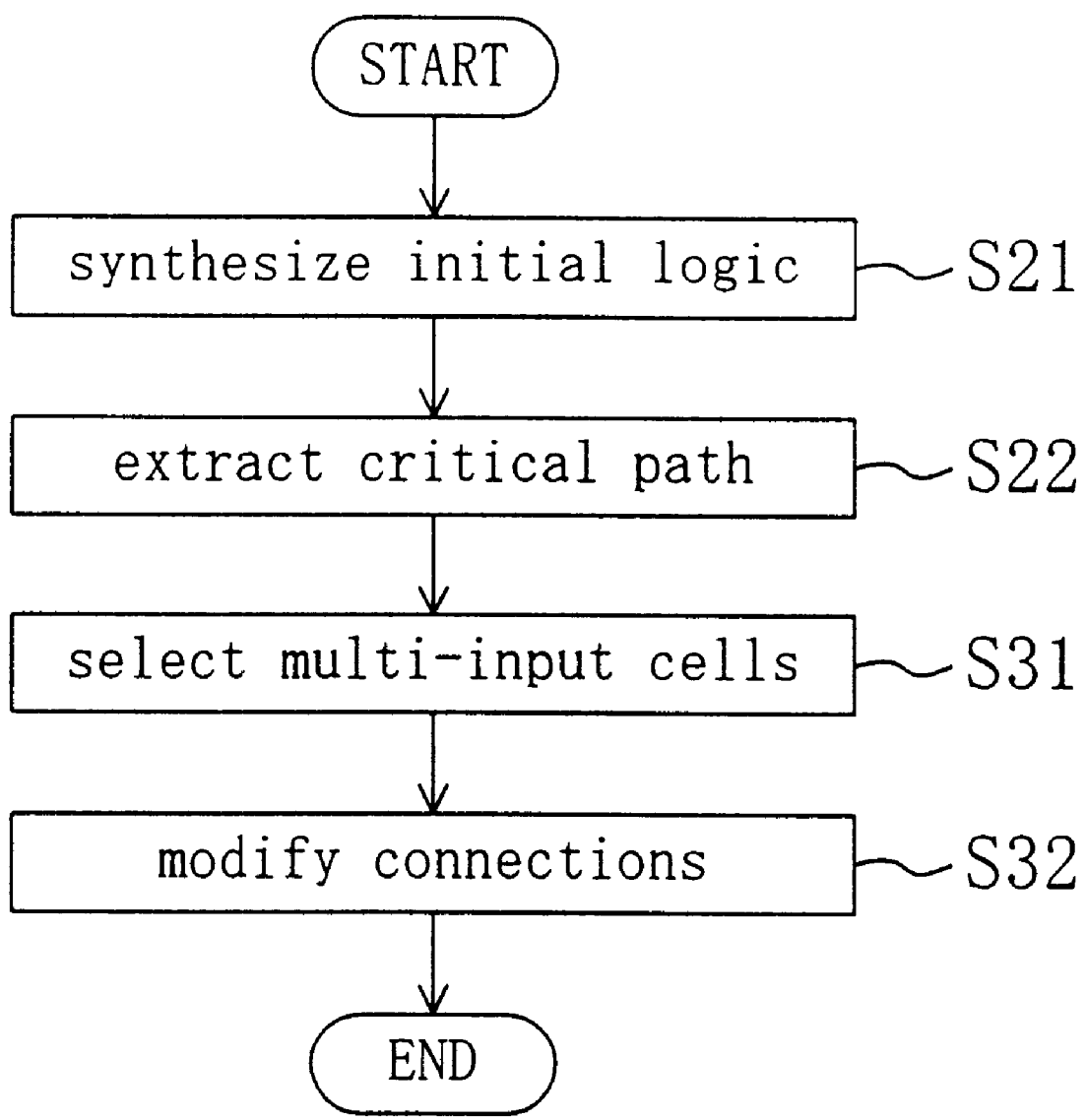
FIG. 5 is a flowchart illustrating a logical design method for a semiconductor integrated circuit according to a third embodiment of the present invention.

FIG. 5 is a flowchart illustrating a logical design method for a semiconductor integrated circuit according to the third embodiment. As shown in FIG. 5, the design process includes the steps of: synthesizing initial logic S21; extracting a critical path S22; selecting multi-input cells S31; and modifying connections S32, respectively.

Steps S21 and S22 are the same as the counterparts illustrated in FIG. 2, and the description thereof will be omitted herein.

Figure 6A:
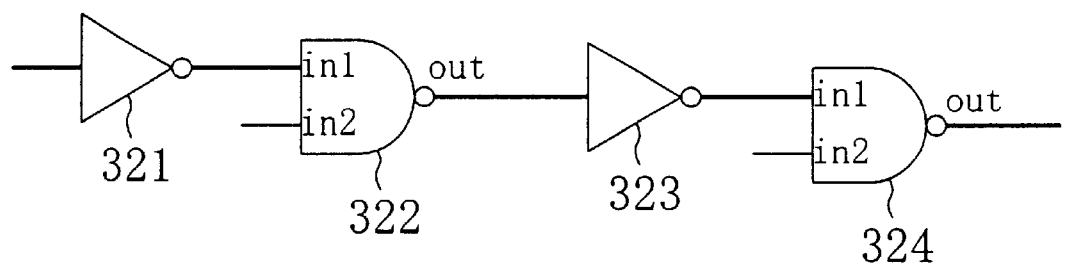
FIGS. 6(a) and 6(b) are circuit diagrams illustrating the design method shown in FIG. 5 by way of example.

In the illustrated embodiment, the circuit shown in FIG. 6(a) is generated in Step S21, and the critical path indicated by the bold line in FIG. 6(a) is extracted in Step S22. Specifically, the critical path passes in and out of an inverter 321, in1 and out of a NAND cell 322, in and out of another inverter 323 and in1 and out of another NAND cell 324 in this order as shown in FIG. 6(a).

In Step S31, multi-input logic cells with two or more input terminals are selected from the cells on the critical path. In the illustrated embodiment, the NAND cells 322 and 324 are selected from the circuit shown in FIG. 6(a).

In Step S32, the connections of the multi-input logic cells on the critical path are modified by reference to a delay library to minimize the sum of degradation rates on the critical path.

Figures 7A, 7B:
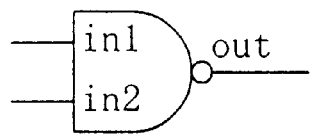
FIGS. 7(a) and 7(b) illustrate an exemplary delay library applicable to the third embodiment.

FIGS. 7(a) and 7(b) illustrate an exemplary delay library for use in the third embodiment. FIG. 7(a) illustrates a two-input NAND cell with input terminals in1 and in2. FIG. 7(b) illustrates exemplary description in the delay library, i.e., data about the degradation rates of the two-input NAND cell shown in FIG. 7(a).

As already described in the first embodiment, if transistors connected to respective input terminals of a logic cell are operated under predetermined conditions, the degradation rates of these transistors will be different from each other. And the degradation rates associated with respective paths passing these transistors will also be mutually different.

In the third embodiment, difference in degradation rate among multiple paths of a logic cell will be taken advantage of. Thus, data that is so described as to rank the degradation rates of respective paths in a multi-input logic cell needs to be stored in the delay library. Such data may be either data representing the ranking of the degradation rates or the degradation rates themselves.

Also, that data is so described as to obtain single representative ranking of degradation rates associated with multiple paths in each logic cell. Thus, the data can be used without specifying operating conditions for the respective paths of the logic cell.

To obtain that data, the degradation rates associated with multiple paths leading from respective input terminals to the output terminal in each logic cell or the ranking thereof is obtained in advance by performing circuit simulations, for example. In obtaining the degradation rates of the paths within the same logic cell, the operating conditions, e.g., waveform of an input signal applied to the input terminals of the paths, number of times the input signal changes its level and load capacitance connected to the output terminal, are supposed to be the same for all of these paths. Optionally, the degradation rates may be ranked among these paths in view of the fact that a transistor closest to the output terminal will result in the highest degradation rate as described in the first embodiment.

In the delay library illustrated in FIG. 7(b), the description pin=<in1, in2> enumerates the paths of the two-input NAND cell in the descending order of their degradation rates. That is to say, in the example shown in FIG. 7(b), the path leading from the input terminal in1 to the output terminal out has the higher degradation rate and the path leading from the input terminal in2 to the output terminal out has the lower degradation rate.

In FIG. 7(b), the ranking of the degradation rates of respective paths is represented by the order of the names of the input terminals enumerated. Alternatively, a number representing the rank of the degradation rate of each path may be shown for the name of its associated input terminal. Or the ranking of the degradation rates among the paths may also be represented using the names of their associated input terminals and signs of inequality.

Figure 6B:
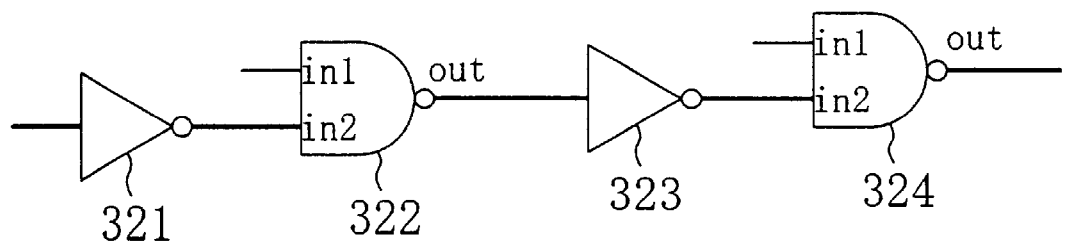

The data in the delay library illustrated in FIG. 7(b) shows that the path passing the input terminal in2 has the lower degradation rate in the two-input NAND cell illustrated in FIG. 7(a). Accordingly, in step S32, the connections to the input terminals of the NAND cells 322 and 324 selected in Step S31 are modified such that the critical path passes the paths associated with the input terminals in2 thereof. In FIG. 6(a), the critical path passes the path associated with the input terminal in1 in the NAND cell 322, for example. Thus, by exchanging the connection to the input terminal in1 of the NAND cell 322 with the connection to the other input terminal in2 thereof, the circuit shown in FIG. 6(a) is changed into the circuit shown in FIG. 6(b).

In the foregoing example, data about a two-input NAND cell is stored in the delay library. As for any other multi-input logic cell, such data that is described to rank the degradation rates, e.g., ranking of degradation rates among paths or the degradation rates themselves, should also be stored in the delay library. The data used in this embodiment can be in a smaller quantity compared to the degradation rate data defined in view of the operating conditions on respective paths.

In the foregoing embodiment, data is so described as to rank the degradation rates of multiple paths in the same logic cell without specifying operating conditions for these paths. Accordingly, a circuit that can suppress increase in delay on the critical path due to degradation with time is easily realizable and the degradation of the overall circuit is minimized without obtaining the number of times each path has operated in a logic cell by performing logic simulations. As a result, possible timing errors and erroneous operation of the circuit, which usually result from degradation with time, can be greatly reduced.

Hereinafter, modified examples of the logical design method for a semiconductor integrated circuit will be described. In the following modified examples, the delay library such as that shown in FIG. 7(b), storing data so described as to rank the degradation rates of multiple paths in the same logic cell without specifying operating conditions for the paths, will be used.

MODIFIED EXAMPLE 1

Generally speaking, a logic cell with a single-stage transistor structure is more likely to degrade with time than a logic cell with a multi-stage transistor structure. As used herein, the "logic cell with a single-stage transistor structure" is a logic cell including a transistor whose gate is the input terminal of the logic cell and whose source or drain is the output terminal of the logic cell. In contrast, the "logic cell with a multi-stage transistor structure" means a logic cell not including such a transistor.

Examples of logic cells with the single-stage transistor structure include inverters, NAND cells and NOR cells, while examples of the logic cells with the multi-stage transistor structure include buffers, AND cells and OR cells.

When a logic cell degrades with time, its output signal changes its level less steeply. Also, the less steeply its input signal changes, the more likely a logic cell degrades. Thus, in the logical synthesis process according to this embodiment, the output of a logic cell with a single-stage transistor structure is provided to an input terminal, associated with a path less likely to degrade, in a logic cell on the next stage.

Figure 8:
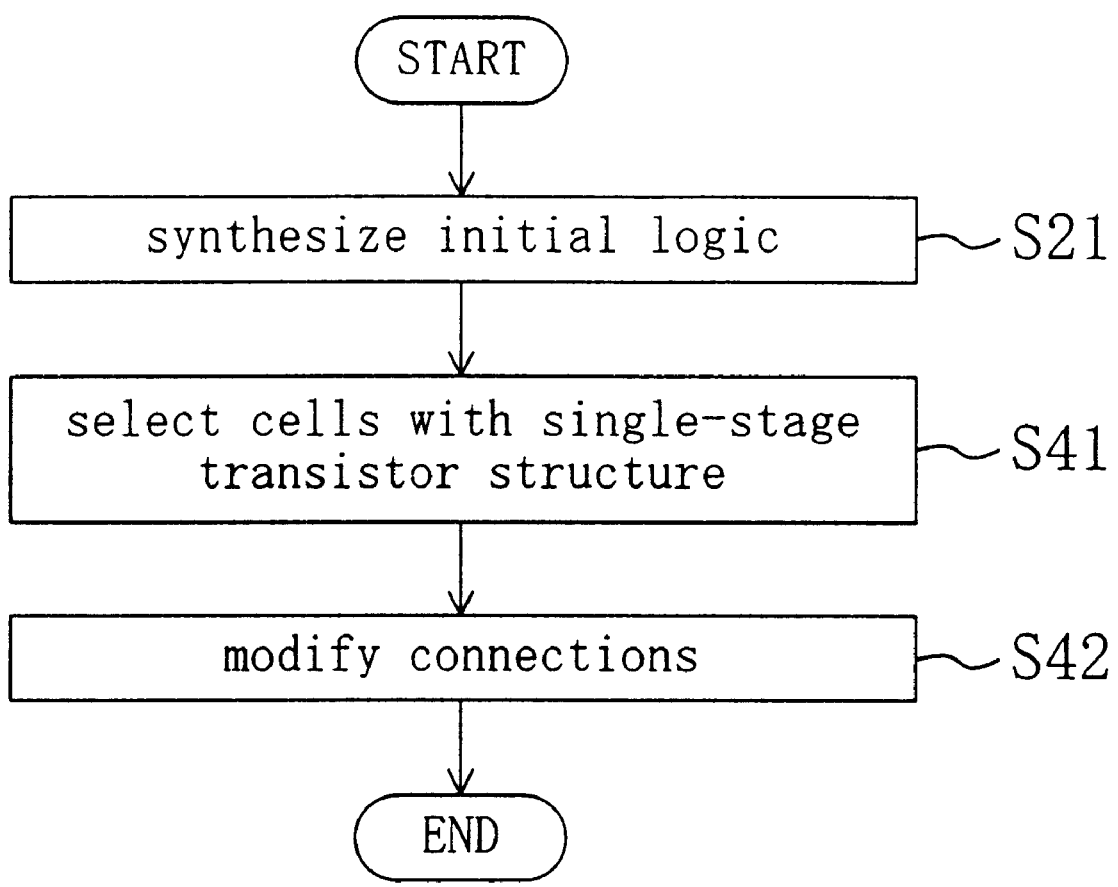
FIG. 8 is a flowchart illustrating a logical design method for a semiconductor integrated circuit according to a first modified example of the third embodiment.
Figure 9A:
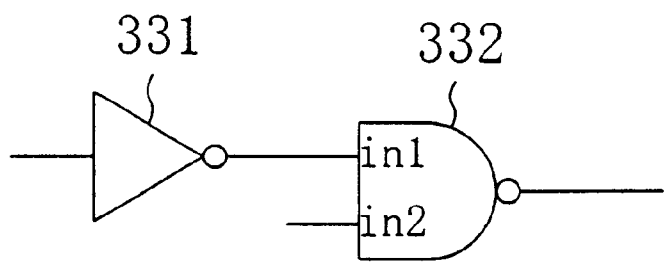
FIGS. 9(a) and 9(b) are circuit diagrams illustrating the design method shown in FIG. 8 by way of example.
Figure 9B:
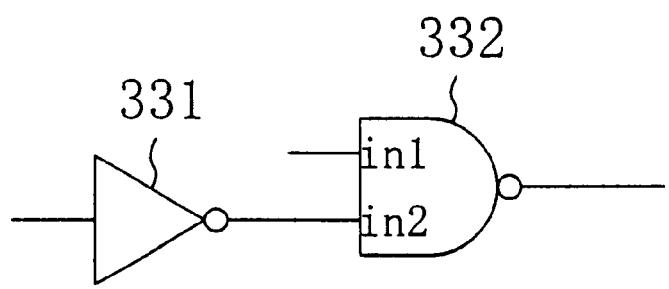

FIG. 8 is a flowchart illustrating a logical design method for a semiconductor integrated circuit according to the first modified example of the third embodiment. As shown in FIG. 8, the design process includes the steps of: synthesizing initial logic S21; selecting cells with a single-stage transistor structure S41; and modifying connections S42, respectively. FIGS. 9(a) and 9(b) are circuit diagrams illustrating the design process shown in FIG. 8 by way of example.

Step S21 is the same as the counterpart illustrated in FIG. 2, and the description thereof will be omitted herein. In the illustrated example, the circuit shown in FIG. 9(a) is generated in Step S21.

In Step S41, logic cells with the single-stage transistor structure are selected from the circuit shown in FIG. 9(a). In the illustrated example, the inverter 331 and the NAND cell 332 are both selected from the circuit shown in FIG. 9(a).

Next, in Step S42, the connections are modified using the delay library such that the output of the inverter 331 selected in Step S41 is provided to one of the input terminals, which is associated with a path that is least likely to degrade, in the NAND cell 332 on the next stage.

Suppose the data representing the ranking of degradation rates of multiple paths in the NAND cell 332 such as that illustrated in FIG. 7(b) is stored in the delay library. In that case, it can be seen that a path passing the input terminal in1 is more likely to degrade than a path passing the other input terminal in2. Thus, as shown in FIG. 9(b), the connections to the input terminals in1 and in2 are exchanged with each other in such a manner that the output of the inverter 331 is provided to the input terminal in2 of the NAND cell 332.

Since the NAND cell 332 is also a logic cell with the single-stage transistor structure, the connections are also modified in the same way for a logic cell next to the NAND cell 332 although not shown.

In this manner, increase in delay, caused on a path including a logic cell with a single-stage transistor structure due to degradation with time, can be suppressed according to this modified example. As a result, the possibility of timing errors and erroneous operation can be minimized.

MODIFIED EXAMPLE 2

In this modified example, a signal that is very likely to change its level is provided to an input terminal, which is associated with one of the paths that is less likely to degrade, in a logic cell.

The frequency of occurrence of level changes in a signal can be represented as a switching probability. Also, a probability that a signal in a logic circuit becomes "1" (e.g., the level of the signal is represented as a high potential) is called a "transition probability". First, the transition probability will be described.

The transition probability may be derived by a completely uncorrelated model (CUM) method. For example, suppose the probabilities of being "1" are represented as $p_1$ and $p_2$ for two input signals of a two-input AND cell. In that case, the transition probability of its output is $p_1p_2$. This is because the output of the AND cell becomes "1" only when both inputs are "1". The CUM method does not take correlation between signals into consideration.

Next, consider a situation where there is correlation between two signals. For example, if one of two signals is always an inverted version of the other, then the transition probability of an AND cell will be zero. A binary decision diagram (BBD) method is one of such methods as taking signal correlation into consideration (see Proceedings of IEEE 31$^{st}$ Design Automation Conference, pp. 18–23, 1994, for example).

In general, a Boolean function with a number n of inputs $y=f\{x_1, \ldots, x_n\}$ is modifiable into $y=x_i f_{xi}+x'_i f_{x'i}$ by Shannon expansion with respect to $x_i$, where $x'_i$ is an inverse of $x_i$. The first term corresponds to $x_i=1$ and the second term corresponds to $x_i=0$. When the transition probabilities of input variables are represented as $P(x_1), \ldots, P(x_n)$, the transition probability for y is given by $$P(y)=P(x_i, f_{xi})+P(x'_i, f_{x'i})=P(x_i)P(f_{xi})+P(x'_i)P(f_{x'i}) \quad (1)$$

This is because the respective terms of y are independent of each other (i.e., cannot be "1" at the same time). For example, a Shannon expanded equation for a two-input AND cell is given by $y=a\cdot b=a\cdot b+a'\cdot 0$, where a and b are input values, y is an output value and a' is the inverse of a. That is to say, $P(y)=P(a)P(b)$. Since $P(a)=P(b)=1/2$, $P(y)=1/4$.

The Shannon expansion equation is described in detail by G. K. Yeap in "Practical Low Power Digital VLSI Design", Kluwer Academic Publishers, 1998.

Also, supposing respective input signals to a circuit are temporally independent of each other, the switching probability sp, which is a probability that a logical state changes within one clock period, is given by $$sp=2P(n)(1-P(n)) \quad (2)$$

where P(n) is a transition probability at a node n.

Figure 10:
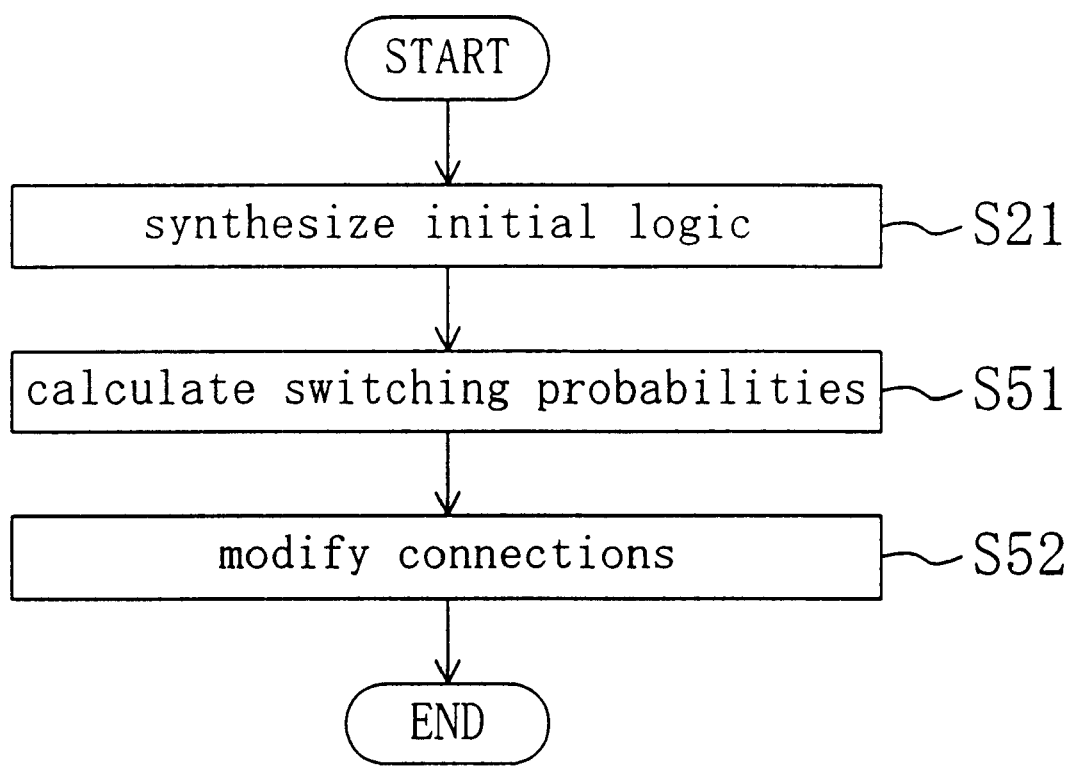
FIG. 10 is a flowchart illustrating a logical design method for a semiconductor integrated circuit according to a second modified example of the third embodiment.
Figure 11A:
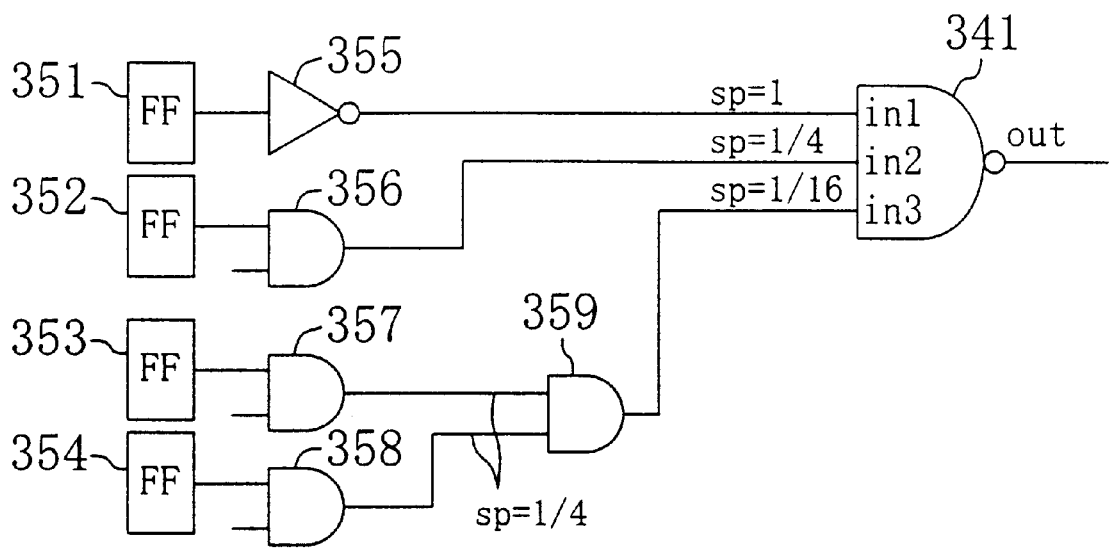
FIGS. 11(a) and 11(b) are circuit diagrams illustrating the design method shown in FIG. 10 by way of example.
Figure 11B:
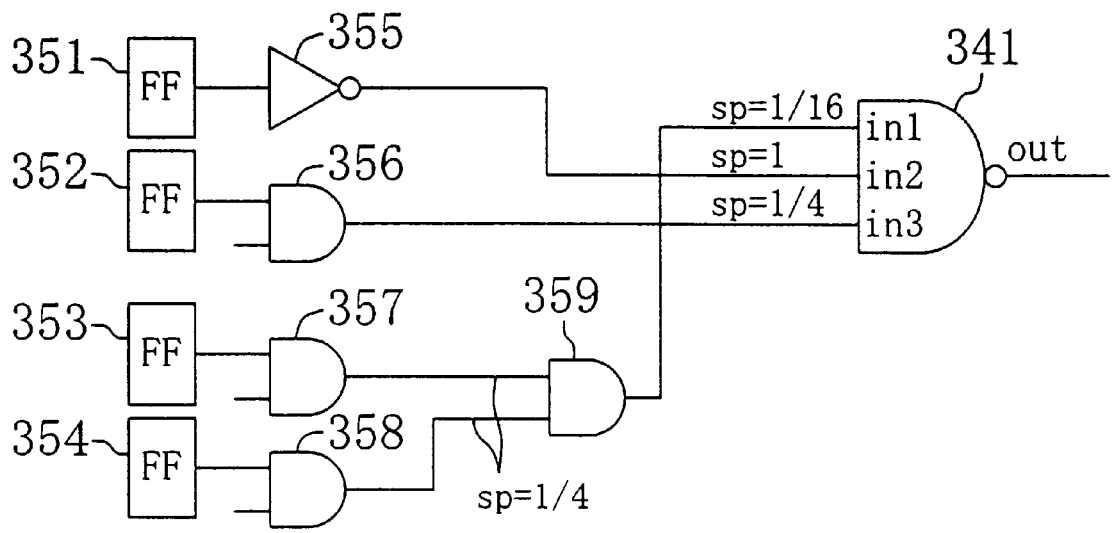

FIG. 10 is a flowchart illustrating a logical design method for a semiconductor integrated circuit according to the second modified example of the third embodiment. As shown in FIG. 10, the design process includes the steps of: synthesizing initial logic S21; calculating switching probabilities S51; and modifying connections S52, respectively. FIGS. 11(a) and 11(b) are circuit diagrams illustrating the design method shown in FIG. 10 by way of example. In FIGS. 11(a) and 11(b), sp represents a switching probability.

Step S21 is the same as the counterpart illustrated in FIG. 2, and the description thereof will be omitted herein. In the illustrated example, part of the circuit generated in Step S21 is illustrated in FIG. 11(a).

Next, in Step S51, the switching probabilities of the signals in the circuit shown in FIG. 11(a) are calculated by the CUM method, for example. In FIG. 11(a), the switching probabilities of the outputs of flip-flops 351 through 354 are all assumed to be "1".

When the switching probability of an input is "1", the switching probability of an output is 1 for an inverter cell, 1/4 for a two-input AND cell and 1/8 for a three-input AND cell. Considering the propagation of signals, the switching probabilities of the outputs of the AND cells 357 and 358 are both 1/4. Thus, the switching probability of the output of the AND cell 359 is $1/4 \times 1/4 = 1/16$.

If the switching probabilities of the other cells are also calculated in the same way, then the switching probabilities at the input terminals in1, in2 and in3 of the NAND cell 341 are 1, 1/4 and 1/16, respectively.

Subsequently, in Step S52, the connections of the NAND cell 341 are modified using the delay library such that an input signal with the highest switching probability of the three inputs is provided to one of the input terminals, associated with a path that is least likely to degrade, in the NAND cell 341.

For example, suppose the data stored in the delay library shows that the degradation rates of the paths in the NAND cell 341 are ranked as in1, in3 and in2 by the names of the input terminals associated with these paths. In that case, it can be seen that the path associated with the input terminal in1 is most likely to degrade and that the path associated with the input terminal in2 is least likely to degrade.

Thus, as shown in FIG. 11(b), the output of the inverter cell 355 with a switching probability of 1 is provided to the input terminal in2 of the NAND cell 341. The output of the AND cell 359 with a switching probability of 1/16 is provided to the input terminal in1 of the NAND cell 341, because the signal changes its level a few times. And the output of the AND cell 356 with a switching probability of 1/4 is provided to the input terminal in3 of the NAND cell 341.

In that case, the path associated with the input terminal in1, which is most likely to degrade in the three-input AND cell 341, has to operate a much smaller number of times. As a result, the degradation caused on the path with time can be minimized. Although the path that is least likely to degrade should operate a greater number of times, delay does not increase so much because this path degrades only slightly.

In this manner, increase in delay of the entire circuit can be suppressed according to this modified example, thus minimizing the possibility of timing errors and erroneous operations.

In this modified example, a switching probability is obtained statically from a transition probability. Alternatively, the switching probability may be obtained dynamically by performing logical simulations.

MODIFIED EXAMPLE 3

In this modified example, a signal changing its level relatively frequently, e.g., an output of a sequential logic circuit like a flip-flop, is provided to one of input terminals, associated with a path that is less likely to degrade, in a logic cell.

Figure 12:
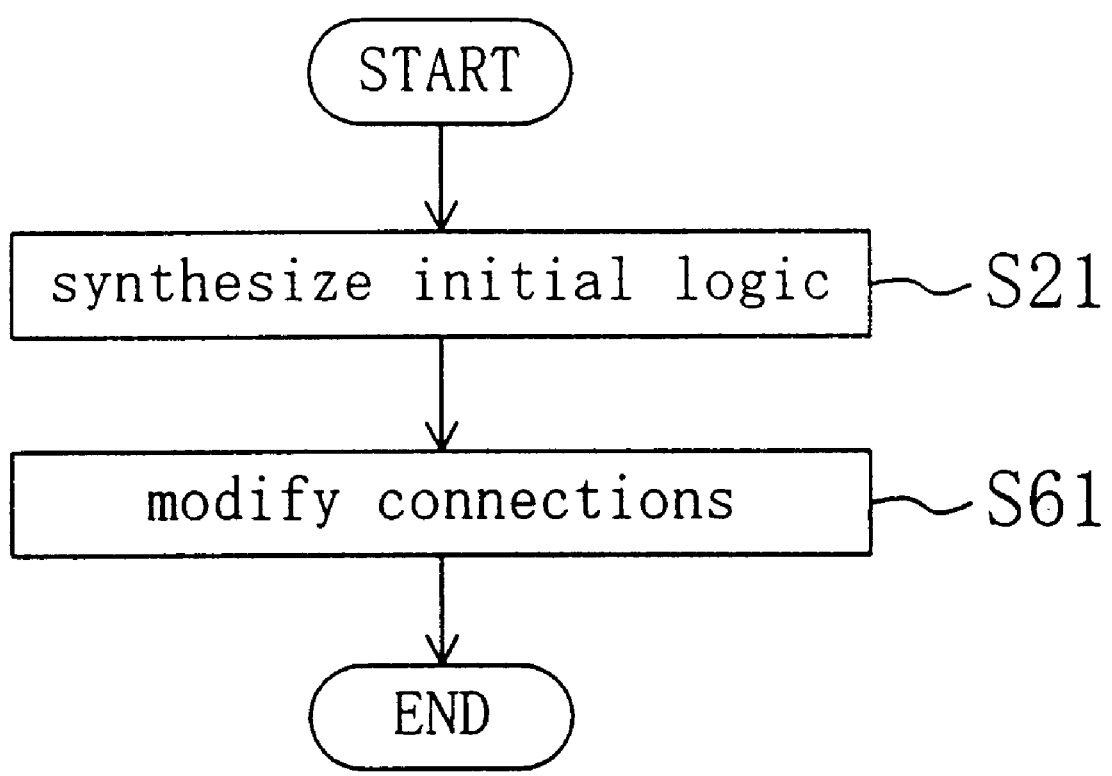
FIG. 12 is a flowchart illustrating a logical design method for a semiconductor integrated circuit according to a third modified example of the third embodiment.

FIG. 12 is a flowchart illustrating a logical design method for a semiconductor integrated circuit according to a third modified example of the third embodiment. As shown in FIG. 12, the design process includes the steps of: synthesizing initial logic S21; and modifying connections S61, respectively. FIGS. 13(a) through 13(d) are circuit diagrams illustrating the design method shown in FIG. 12 by way of example.

Step S21 is the same as the counterpart illustrated in FIG. 2, and the description thereof will be omitted herein. In the illustrated example, two parts of the circuits generated in Step S21 are illustrated in FIGS. 13(a) and 13(c), respectively.

Generally speaking, a sequential logic circuit, like a flip-flop, to which a clock signal is input, outputs a signal changing its level frequently. The highest switching probability of such a signal can be represented as "1". Such a signal is preferably provided to an input terminal associated with a path that is less likely to degrade.

Figure 13A:
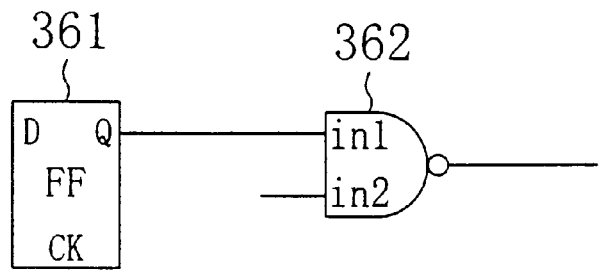
FIGS. 13(a) through 13(d) are circuit diagrams illustrating the design method shown in FIG. 12 by way of example.

In Step S61, the connections of the circuit shown in FIG. 13(a) are modified using a delay library such that the output of a flip-flop 361 is provided to an input terminal, associated with a path that is least likely to degrade, in a NAND cell 362 on the next stage.

Figure 13B:
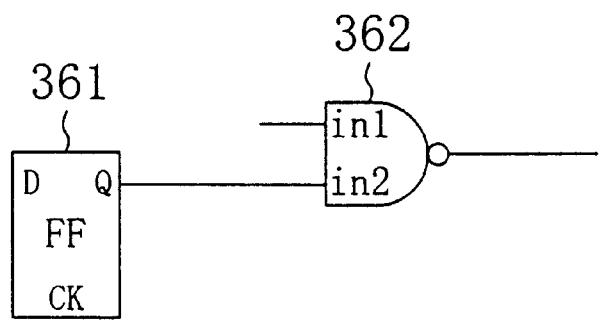
Figure 13C:
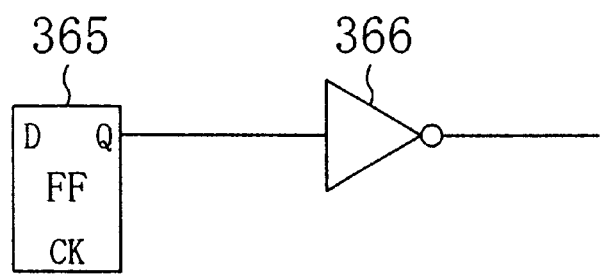

Suppose the data representing the ranking of degradation rates of respective paths in the NAND cell 362 such as that illustrated in FIG. 7(b) is stored in the delay library. In that case, it can be seen that a path passing the input terminal in1 is more likely to degrade than a path passing the other input terminal in2. Thus, as shown in FIG. 13(b), the connections to the input terminals in1 and in2 are exchanged with each other in such a manner that the output of the flip-flop 361 is provided to the input terminal in2 of the NAND cell 362.

Also, in Step S61, an inverter cell 366 connected to a flip-flop 365 is replaced with a two-input NAND cell 367 as for the circuit shown in FIG. 13(c). Suppose the data representing the ranking of degradation rates of respective paths in the NAND cell 367 such as that illustrated in FIG. 7(b) is stored in the delay library, too. In that case, the connections of the circuit shown in FIG. 13(c) are modified by reference to the delay library such that the output of the flip-flop 365 is provided to an input terminal, associated with a path that is least likely to degrade, in the NAND cell 367.

Figure 13D:
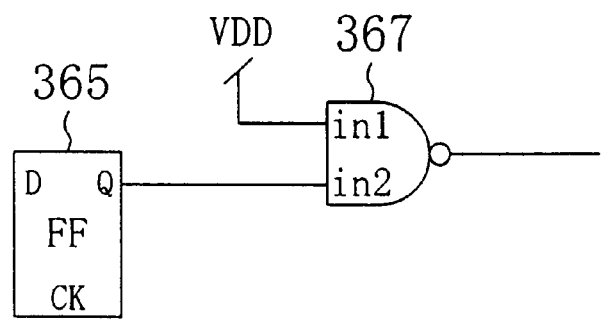

In the illustrated example, the output of the flip-flop 365 is provided to the input terminal in2 of the NAND cell 367 as shown in FIG. 13(d), and a supply voltage VDD is applied to the remaining input terminal in1.

In this manner, according to this modified example, connections are modified such that the output of a flip-flop, which operates most frequently, is provided to a terminal associated with a path that is less likely to degrade, thereby suppressing increase in delay on the entire path. As a result, the possibility of timing errors and erroneous operation of the circuit can be reduced.

According to this embodiment, not only the data shown in FIG. 4(b) for obtaining the degradation rates of respective paths considering the operation conditions thereof, but also the data shown in FIG. 7(b) representing the ranking of degradation rates of those paths without taking the operation conditions into account may be stored in the delay library.

In general, no matter how many times paths of a logic cell are operated, the ranking of the degradation rates of those paths in the logic cell usually remains the same so long as those paths are operated the same number of times. Should the ranking change, however, data that is so described as to rank the degradation rates in view of the number of times of operation needs to be obtained in advance.

In the foregoing embodiment, a circuit that is less affected by degradation with time is obtained by changing the connections to input terminals of a logic cell based on the ranking of degradation rates of respective paths in the cell. Actually, though, connections are preferably changed by taking delay times caused by those paths into account as well.

One path of a two-input AND cell, which leads from one input terminal in1 to the output terminal (hereinafter, called Path 1), is supposed to cause a delay time of "1". And the other path thereof, which leads from the other input terminal in2 to the output terminal (hereinafter called Path 2), is supposed to cause a delay time of "2". And the degradation rates associated with Paths 1 and 2 are supposed to be 1.1 and 1.05, respectively. That is to say, suppose the degradation rate associated with Path 2 is smaller than that associated with Path 1. In that case, the delay time that will be caused by Path 1 after degradation is 1×1.1=1.1, whereas the delay time that will be caused by Path 2 after degradation is 2×1.05=2.1. Thus, after the degradation, Path 2 will cause longer delay than Path 1. In this manner, in some cases, Path 2 will be better considering only the ranking of degradation rates, but Path 1 may be preferred considering the delay time after the degradation as well.

EMBODIMENT 4

Figure 14A:
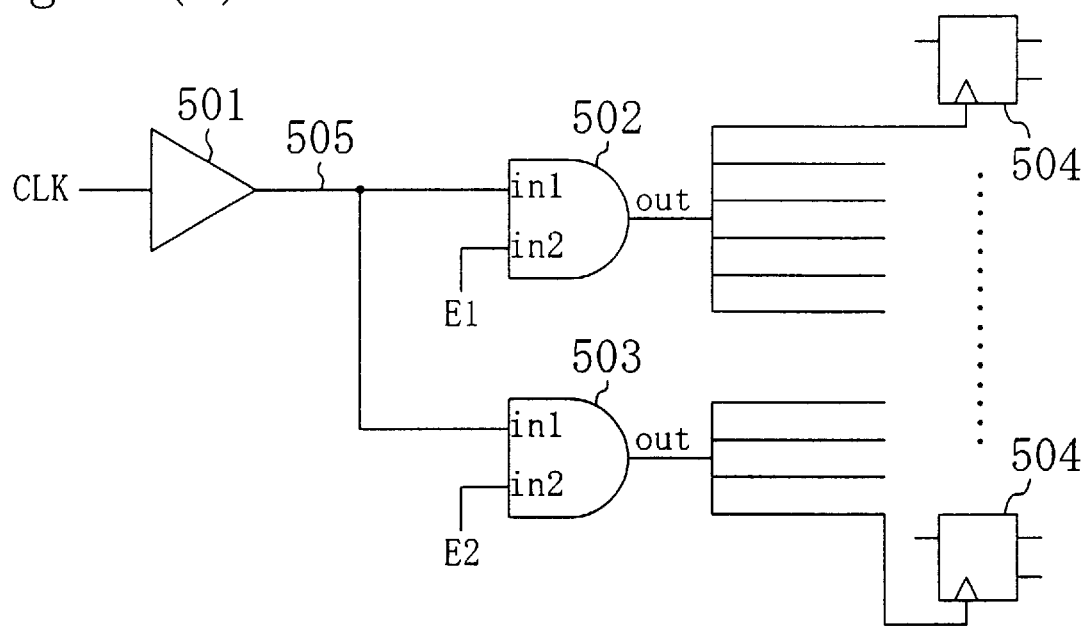
FIGS. 14(a) and 14(b) are circuit diagrams illustrating how to replace a two-input NAND cell with a three-input NAND cell in a clock signal delivery circuit according to a fourth embodiment of the present invention.
Figure 14B:
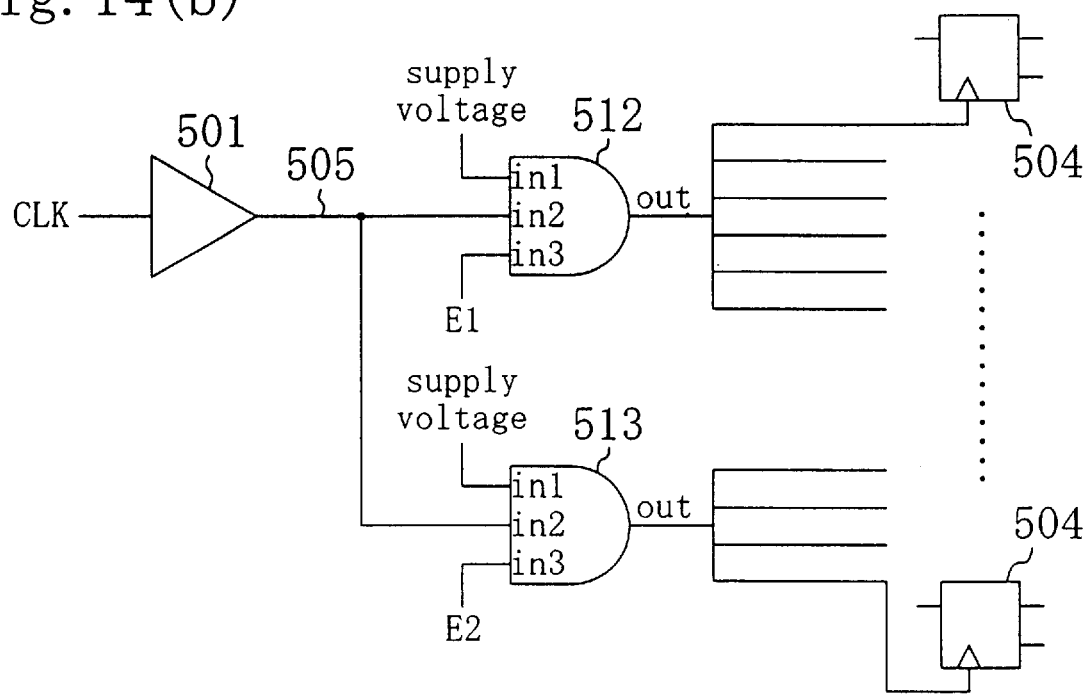

FIGS. 14(a) and 14(b) are circuit diagrams illustrating a semiconductor integrated circuit according to a fourth embodiment of the present invention. According to the fourth embodiment, a logic cell is replaced with another logic cell with a larger number of input terminals.

Hereinafter, a method for suppressing increase in clock skew of a circuit with a gated clock design due to its degradation with time will be described. To reduce power dissipation of an integrated circuit, parts of the circuit that do not have to operate should be suspended on a small section basis by stopping the clock delivery. For that purpose, the number of gating cells tends to be increased in a recent integrated circuit. Accordingly, it is necessary to suppress degradation of those gating cells with time.

FIG. 14(a) illustrates an exemplary clock net structure where the gated clock design is adopted. As shown in FIG. 14(a), the output of a clock buffer 501 is provided to respective input terminals in1 of two-input AND cells 502 and 503 for gating. Gating signals E1 and E2 are supplied to the input terminals in2 of the AND cells 502 and 503, respectively. The output of each of these AND cells 502 and 503 is provided to multiple flip-flop cells 504.

A clock signal CLK is always delivered to the AND cells 502 and 503 by way of the clock buffer 501. The AND cell 502 outputs the clock signal CLK only when the level of the gating signal E1, i.e., a signal controlling the clock delivery, is represented as logically high potential (H-level). In the same way, the AND cell 503 outputs the clock signal CLK only when the level of the gating signal E2 is represented as H.

The gating signals E1 and E2 for these AND cells 502 and 503 are at the H-level during mutually different intervals. Accordingly, the degradation rate of a path leading from the input terminal in1 of the AND cell 502 to its output terminal out is different from that of a path leading from the input terminal in1 of the AND cell 503 to its output terminal out. That is to say, as these cells 502 and 503 degrade, a skew between the clock signals output by the AND cells 502 and 503 increases.

FIG. 14(b) illustrates an alternative circuit designed to suppress such increase in skew. In the circuit shown in FIG. 14(b), the two-input AND cells 502 and 503 are replaced with three-input AND cells 512 and 513 as substitute AND logic circuits, respectively. As in the circuit shown in FIG. 1(b), each of the three-input AND cells 512 and 513 shown in FIG. 14(b) includes a serial connection of three n-channel transistors between its output terminal out and a ground line. As described in the first embodiment, the degradation rate of an n-channel transistor closest to the output terminal is outstandingly high and the degradation rates of the other n-channel transistors are relatively low in such a circuit.

Thus, suppose the input terminals in1, in2 and in3 are connected to the gates of n-channel transistors that are closest, second closest and third closest to the output terminal out, respectively. In that case, the degradation rate $DR_{in1}$ of a path leading from the input terminal in1 to the output terminal out is the highest of all, while the degradation rates $DR_{in2}$ and $DR_{in3}$ of respective paths leading from the input terminals in2 and in3 to the output terminal out are relatively low. That is to say, $DR_{in1} \gg DR_{in2}, DR_{in3}$ Thus, the clock net 505, which operates more times than any other part of the integrated circuit, is connected to the input terminals in2 of the AND cells 512 and 513. As for the gating signals, paths that do not operate so frequently as the clock net 505 and that will degrade to a lesser degree in the cells are used. Specifically, the gating signals E1 and E2 are provided to the input terminals in3 of the AND cells 512 and 513, respectively. A supply voltage is applied to the input terminals in1 of the AND cells 512 and 513. Since the supply voltage is kept H during the operation of the integrated circuit, degradation of the AND cells 512 and 513 can be suppressed.

In this manner, according to this embodiment, a clock signal, which changes its level frequently, is input to transistors that are less likely to degrade, and a supply voltage, which does not change its signal level, is applied to transistors that are most likely to degrade. As a result, the degradation of the circuit can be reduced and the increase in clock skew can be suppressed even after the circuit has degraded.

In the foregoing embodiment, the clock signal is input to the n-channel transistors that are second closest to the respective output terminals, and the gating signals are input to the transistors that are most distant from the output terminals. Alternatively, the clock signal may be input to the gates of n-channel transistors that are more distant from the output terminals than the n-channel transistors closest to the output terminals (i.e., that will degrade to the highest degree) are.

Also, if the ranking of degradation rates associated with multiple paths from respective input terminals to the output terminal in a logic cell is known from a delay library such as that shown in FIG. 7(b), then the clock signal is preferably provided to an input terminal corresponding to a path with the lowest degradation rate and the gating signal is preferably provided to an input terminal corresponding to a path with the second lowest degradation rate.

In the same way, an AND cell with four or more inputs may be used with the clock and gating signals input to transistors associated with low degradation rates and with a supply voltage applied to the other transistors. Furthermore, AND cells may be replaced with NAND cells.

Moreover, the degradation of a circuit with time may be suppressed by replacing the inverter with a NAND cell. Hereinafter, an example of such a technique will be described.

Figure 15A:
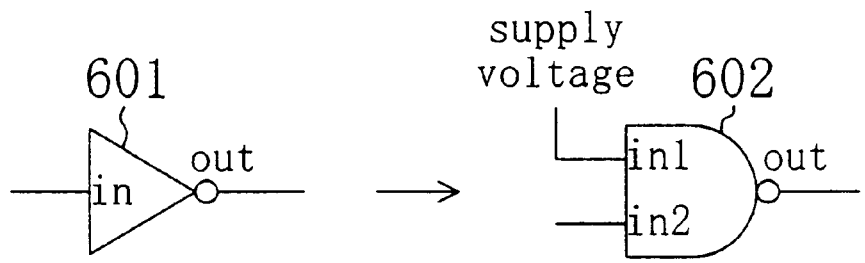
FIGS. 15(a) and 15(b) are circuit diagrams illustrating how to replace an inverter with a two-input NAND cell.
Figure 15B:
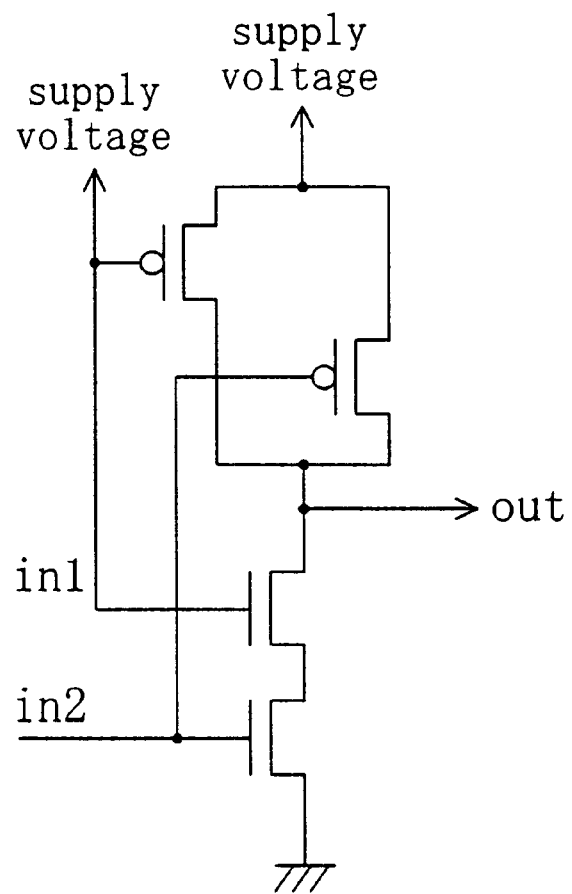
Figure 16A:
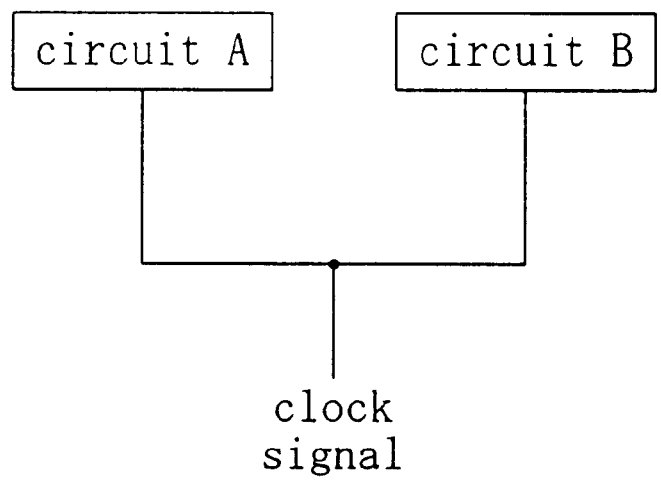
FIGS. 16(a) and 16(b) are block diagrams illustrating methods of delivering a clock signal.
Figure 16B:
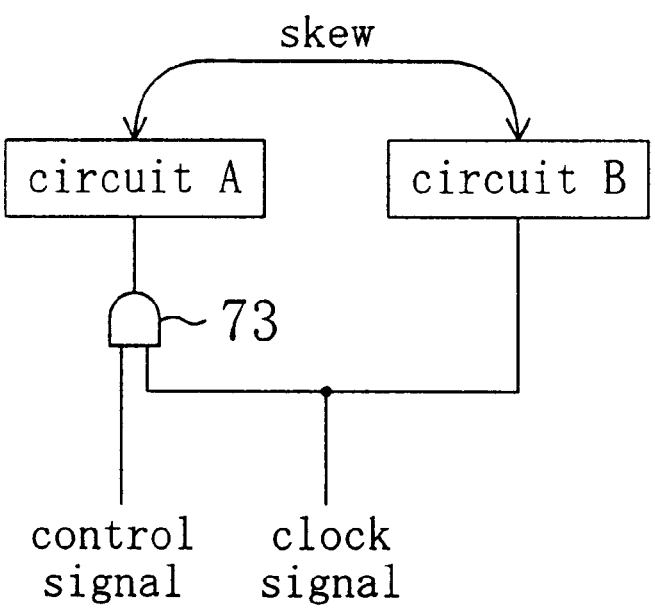

FIG. 15(a) illustrates an inverter 601 and a two-input NAND cell 602. FIG. 15(b) is a circuit diagram of the NAND cell 602. In the following example, the inverter 601 will be replaced with the NAND cell 602. As shown in FIG. 15(b), the NAND cell 602 includes a serial connection of two n-channel transistors between an output terminal out and a ground line. Of these two transistors, one closer to the output terminal is more likely to degrade. Suppose the input terminal in1 of the NAND cell 602 is connected to the gate of that transistor closer to the output terminal. In that case, the degradation rates $DR_{in1}$ and $DR_{in2}$ of respective paths leading from the input terminals in1 and in2 to the output terminal out meet the relationship of $$DR_{in1} \gg DR_{in2}$$

Thus, a supply voltage, which has a substantially constant signal level, is applied to the input terminal in1 and a signal for the input terminal in of the inverter 601 is provided to the other input terminal in2. And the output terminal out of the inverter 601 is replaced with the output terminal out of the NAND cell 602.

In this case, the output signal of the NAND cell 602 is inverse of the input signal provided to the input terminal in2. That is to say, the NAND cell 602 functions as an inverter. Since the supply voltage is kept H during the operation of the integrated circuit, the degradation of the NAND cell 602 with time can be suppressed.

By replacing the inverter 601 with the two-input NAND cell 602 in this manner, the area of the cell is greater but the degradation rate will be lower. Such cell replacement is effectively applicable not only to cells on a clock net but also to cells on a critical path.

The NAND cell may have three or more input terminals. In any case, the input to the inverter may be provided to the gate of an n-channel transistor that is more distant from an output terminal than an n-channel transistor closest to the output terminal (or that will degrade to the highest degree) in the NAND cell. And a supply voltage may be applied to the gates of the other n-channel transistors.

In the foregoing embodiment, the cell replacement is carried out during a logical design process. Alternatively, the cell replacement may be performed during a layout design process.

As is apparent from the foregoing description, the degradation rates of multiple paths in a logic circuit are averaged according to the present invention, thereby avoiding a situation where a path with an outstandingly high degradation rate is a critical path or a path operating frequently. In this manner, the resultant circuit is less likely to be affected by degradation with time, like decreased operating speeds of transistors, or cause timing errors.

What is claimed is:

1. A logical design method for a semiconductor integrated circuit, comprising the steps of:
    a) generating a circuit at a logical level so as to meet given functions and specifications;
    b) extracting a critical path, which will cause the longest delay, from the circuit generated in the step a);
    c) counting how many times a path leading from each input terminal to an output terminal in every logic cell of the circuit has operated;
    d) calculating a degradation rate associated with the path leading from each said input terminal to the output terminal in each said logic cell on the critical path by reference to the number of times of operation obtained in the step c); and
    e) exchanging a connection to one of the input terminals of each said logic cell, which terminal is associated with the critical path, with a connection to another one of the input terminals of the logic cell, which terminal is associated with another path corresponding to a lower degradation rate than that of the critical path, by reference to the degradation rates obtained in the step d).

2. The method of claim 1, wherein in the step d), the degradation rates are obtained using a delay library in which data about the degradation rates associated with multiple paths leading from the respective input terminals to the output terminal of each said logic cell is stored.

3. A logical design method for a semiconductor integrated circuit using a delay library in which data about a multi-input logic cell, including a plurality of input terminals, is stored,
    wherein the data is so described as to obtain representative ranking of degradation rates associated with multiple paths between respective input terminals and an output terminal of the multi-input logic cell without specifying operating conditions for the paths.

4. The method of claim 3, wherein the data represents ranking of the degradation rates associated with the respective paths in the same logic cell.

5. The method of claim 3, comprising the steps of:
   a) generating a circuit at a logical level so as to meet given functions and specifications;
   b) extracting a critical path, which will cause the longest delay, from the circuit generated in the step a);
   c) selecting the multi-input logic cell from logic cells on the critical path; and
   d) exchanging a connection to one of the input terminals of the multi-input logic cell selected in the step c), which terminal is associated with the critical path, with a connection to another one of the input terminals of the logic cell, which terminal is associated with another path corresponding to a lower degradation rate than that of the critical path, by reference to the data stored in the delay library.

6. The method of claim 3, wherein an output of a logic cell implemented as a single-stage transistor is provided to one of the input terminals of the multi-input logic cell by reference to the data stored in the delay library, the terminal provided with the output being associated with one of the paths of the logic cell other than another one of its paths that corresponds to the highest degradation rate.

7. The method of claim 3, comprising steps of:
   a) generating a circuit at a logical level so as to meet given functions and specifications;
   b) obtaining switching probabilities of signals provided to the respective input terminals of the multi-input logic cell in the circuit; and
   c) modifying connections such that one of the signals with the highest switching probability is provided to one of the input terminals of the multi-input logic cell by reference to the data stored in the delay library, the input terminal provided with the signal being associated with one of the paths of the logic cell other than another one of its paths that corresponds to the highest degradation rate.

8. The method of claim 3, wherein an output of a sequential logic circuit operating synchronously with a clock signal is provided to one of the input terminals of the multi-input logic cell by reference to the data stored in the delay library, the terminal provided with the output being associated with one of the paths of the logic cell other than another one of its paths that corresponds to the highest degradation rate.

9. The method of claim 3, wherein if an output of a sequential logic circuit operating synchronously with a clock signal is provided to a single-input logic cell, the single-input logic cell is replaced with the multi-input logic cell, and
   wherein the output is provided to one of the input terminals of the multi-input logic cell by reference to the data stored in the delay library, the terminal provided with the output being associated with one of the paths of the logic cell other than another one of its paths that corresponds to the highest degradation rate.

10. The method of claim 4, comprising the steps of:
    a) generating a circuit at a logical level so as to meet given functions and specifications;
    b) extracting a critical path, which will cause the longest delay, from the circuit generated in the step a);
    c) selecting the multi-input logic cell from logic cells on the critical path; and
    d) exchanging a connection to one of the input terminals of the multi-input logic cell selected in the step c), which terminal is associated with the critical path, with a connection to another one of the input terminals of the logic cell, which terminal is associated with another path corresponding to a lower degradation rate than that of the critical path, by reference to the data stored in the delay library.

11. The method of claim 4, wherein an output of a logic cell implemented as a single-stage transistor is provided to one of the input terminals of the multi-input logic cell by reference to the data stored in the delay library, the terminal provided with the output being associated with one of the paths of the logic cell other than another one of its paths that corresponds to the highest degradation rate.

12. The method of claim 4, comprising steps of:
    a) generating a circuit at a logical level so as to meet given functions and specifications;
    b) obtaining switching probabilities of signals provided to the respective input terminals of the multi-input logic cell in the circuit; and
    c) modifying connections such that one of the signals with the highest switching probability is provided to one of the input terminals of the multi-input logic cell by reference to the data stored in the delay library, the input terminal provided with the signal being associated with one of the paths of the logic cell other than another one of its paths that corresponds to the highest degradation rate.

13. The method of claim 4, wherein an output of a sequential logic circuit operating synchronously with a clock signal is provided to one of the input terminals of the multi-input logic cell by reference to the data stored in the delay library, the terminal provided with the output being associated with one of the paths of the logic cell other than another one of its paths that corresponds to the highest degradation rate.

14. The method of claim 4, wherein if an output of a sequential logic circuit operating synchronously with a clock signal is provided to a single-input logic cell, the single-input logic cell is replaced with the multi-input logic cell, and
    wherein the output is provided to one of the input terminals of the multi-input logic cell by reference to the data stored in the delay library, the terminal provided with the output being associated with one of the paths of the logic cell other than another one of its paths that corresponds to the highest degradation rate.

* * * * *